(12) United States Patent
Harrison et al.

(10) Patent No.: US 8,781,794 B2
(45) Date of Patent: Jul. 15, 2014

(54) METHODS AND SYSTEMS FOR CREATING FREE SPACE REFLECTIVE OPTICAL SURFACES

(75) Inventors: Gregory A. Harrison, Oviedo, FL (US); David Alan Smith, Cary, NC (US); Gary E. Wiese, Winter Park, FL (US)

(73) Assignee: Lockheed Martin Corporation, Bethesda, MD (US)

( * ) Notice: Subject to any disclaimer, the term of this patent is extended or adjusted under 35 U.S.C. 154(b) by 92 days.

(21) Appl. No.: 13/211,389

(22) Filed: Aug. 17, 2011

(65) Prior Publication Data

US 2012/0123742 A1  May 17, 2012

Related U.S. Application Data

(60) Provisional application No. 61/405,440, filed on Oct. 21, 2010, provisional application No. 61/417,325, filed on Nov. 26, 2010, provisional application No. 61/417,326, filed on Nov. 26, 2010, provisional application No. 61/417,327, filed on Nov. 26, 2010, provisional application No. 61/417,328, filed on Nov. 26, 2010, provisional application No. 61/427,530, filed on Dec. 28, 2010.

(51) Int. Cl.
*G06F 17/50* (2006.01)
*G02B 27/14* (2006.01)

(52) U.S. Cl.
USPC .............................. 703/1; 359/630; 359/631

(58) Field of Classification Search
USPC .................. 703/1; 345/7–8; 359/13, 630–631
See application file for complete search history.

(56) References Cited

U.S. PATENT DOCUMENTS

| | | | |
|---|---|---|---|
| 3,880,509 A | 4/1975 | Herndon et al. | |
| 4,026,641 A | 5/1977 | Bosserman et al. | |
| 5,309,169 A | 5/1994 | Lippert | |
| 5,325,386 A | 6/1994 | Jewell et al. | |
| 5,347,400 A | 9/1994 | Hunter | |

(Continued)

FOREIGN PATENT DOCUMENTS

| | | |
|---|---|---|
| CA | 2750287 A1 | 11/2011 |
| CA | 2750287 C | 7/2012 |

(Continued)

OTHER PUBLICATIONS

Kiyokawa, Kiyoshi, "A Wide Field-of-View Head Mounted Projective Display Using Hyperbolic Half-Silvered Mirrors," IEEE, Nov. 16, 2007, Cybermedia Center, Osaka University, Osaka, Japan.

(Continued)

*Primary Examiner* — Aniss Chad
(74) *Attorney, Agent, or Firm* — Withrow & Terranova, PLLC

(57) ABSTRACT

Computer-based methods and associated computer systems are disclosed for designing free space reflective optical surfaces (13) for use in head-mounted displays (HMDs). The reflective optical surface (13) produces a virtual image of a display surface (11) for viewing by a user's eye (15). The method includes using one or more computers to: (i) represent the display surface (11) by display objects (25); (ii) represent the free space reflective optical surface (13) by surface elements (23); and (iii) iteratively calculate spatial locations, normals, and radii of curvature for the surface elements (23) which will cause a virtual image of each display object (25) to be displayed to a nominal user's eye (15) in a desired direction of gaze of the eye (15).

19 Claims, 10 Drawing Sheets

(56) References Cited

U.S. PATENT DOCUMENTS

| | | | |
|---|---|---|---|
| 5,561,538 A | 10/1996 | Kato et al. |
| 5,572,343 A | 11/1996 | Okamura et al. |
| 5,581,271 A | 12/1996 | Kraemer |
| 5,699,194 A | 12/1997 | Takahashi |
| 5,701,132 A | 12/1997 | Kollin et al. |
| 5,701,202 A | 12/1997 | Takahashi et al. |
| 5,712,649 A | 1/1998 | Tosaki et al. |
| 5,754,344 A | 5/1998 | Fujiyama |
| 5,757,544 A | 5/1998 | Tabata et al. |
| 5,774,268 A | 6/1998 | Takahashi |
| 5,798,739 A | 8/1998 | Teitel et al. |
| 5,834,676 A | 11/1998 | Elliott |
| 5,844,530 A | 12/1998 | Tosaki |
| 5,982,343 A | 11/1999 | Iba et al. |
| 6,038,387 A | 3/2000 | Machida |
| 6,140,979 A | 10/2000 | Gerhard et al. |
| 6,140,980 A | 10/2000 | Spitzer et al. |
| 6,160,666 A | 12/2000 | Rallison et al. |
| 6,201,646 B1 | 3/2001 | Togino et al. |
| 6,215,593 B1 | 4/2001 | Bruce |
| 6,266,194 B1 | 7/2001 | Tanijiri |
| 6,445,362 B1 | 9/2002 | Tegreene |
| 6,522,474 B2 | 2/2003 | Cobb et al. |
| 6,529,331 B2 | 3/2003 | Massof et al. |
| 6,549,332 B2 * | 4/2003 | Kimura | 359/366 |
| 6,633,304 B2 | 10/2003 | Anabuki et al. |
| 6,646,811 B2 | 11/2003 | Inoguchi |
| 6,704,128 B2 | 3/2004 | Takeyama et al. |
| 6,731,434 B1 | 5/2004 | Hua et al. |
| 6,751,026 B2 | 6/2004 | Tomono |
| 6,771,423 B2 | 8/2004 | Geist |
| 6,795,042 B1 | 9/2004 | Nagata et al. |
| 6,813,085 B2 | 11/2004 | Richards |
| 6,829,087 B2 | 12/2004 | Freese et al. |
| 6,873,471 B2 | 3/2005 | Coates |
| 6,919,866 B2 | 7/2005 | Kanevsky et al. |
| 6,963,379 B2 | 11/2005 | Tomono |
| 7,002,551 B2 | 2/2006 | Azuma et al. |
| 7,009,773 B2 | 3/2006 | Chaoulov et al. |
| 7,063,256 B2 | 6/2006 | Anderson et al. |
| 7,072,096 B2 | 7/2006 | Holman et al. |
| 7,095,562 B1 | 8/2006 | Peng |
| 7,119,965 B1 * | 10/2006 | Rolland et al. | 359/630 |
| 7,151,639 B2 | 12/2006 | Lung |
| 7,295,377 B2 | 11/2007 | Edelmann |
| 7,324,081 B2 | 1/2008 | Friedrich et al. |
| 7,339,742 B2 | 3/2008 | Amitai et al. |
| 7,385,600 B2 | 6/2008 | Marion |
| 7,391,573 B2 | 6/2008 | Amitai |
| 7,432,879 B2 | 10/2008 | Schonlau |
| 7,446,941 B2 | 11/2008 | Fukuda |
| 7,499,217 B2 | 3/2009 | Cakmakci et al. |
| 7,545,571 B2 | 6/2009 | Garoutte et al. |
| 7,573,525 B2 | 8/2009 | Yamasaki |
| 7,605,773 B2 | 10/2009 | Janssen |
| 7,613,356 B2 | 11/2009 | Uchiyama et al. |
| 7,623,294 B2 | 11/2009 | Harada et al. |
| 7,732,694 B2 | 6/2010 | Rosenberg |
| 7,751,122 B2 | 7/2010 | Amitai |
| 7,804,507 B2 | 9/2010 | Yang et al. |
| 7,812,815 B2 | 10/2010 | Banerjee et al. |
| 7,843,403 B2 | 11/2010 | Spitzer |
| 7,928,927 B1 | 4/2011 | Krenz et al. |
| 7,949,295 B2 | 5/2011 | Kumar et al. |
| 8,046,719 B2 | 10/2011 | Skourup et al. |
| 8,059,342 B2 | 11/2011 | Burke |
| 2001/0033401 A1 | 10/2001 | Kasai et al. |
| 2002/0036649 A1 | 3/2002 | Kim et al. |
| 2002/0094189 A1 | 7/2002 | Navab et al. |
| 2002/0163486 A1 | 11/2002 | Ronzani et al. |
| 2002/0186179 A1 | 12/2002 | Knowles |
| 2002/0196554 A1 * | 12/2002 | Cobb et al. | 359/633 |
| 2004/0130783 A1 | 7/2004 | Solomon |
| 2005/0046953 A1 | 3/2005 | Repetto et al. |
| 2006/0103590 A1 | 5/2006 | Divon |
| 2006/0281061 A1 | 12/2006 | Hightower et al. |
| 2007/0097277 A1 | 5/2007 | Hong et al. |
| 2007/0132785 A1 | 6/2007 | Ebersole et al. |
| 2007/0177275 A1 | 8/2007 | McGuire, Jr. |
| 2007/0219760 A1 | 9/2007 | Yang et al. |
| 2007/0236800 A1 | 10/2007 | Cakmakci et al. |
| 2007/0243916 A1 | 10/2007 | Lee |
| 2008/0130309 A1 | 6/2008 | Condon et al. |
| 2008/0204731 A1 | 8/2008 | Williams |
| 2008/0309586 A1 | 12/2008 | Vitale |
| 2009/0002574 A1 | 1/2009 | Sorek et al. |
| 2009/0122385 A1 | 5/2009 | Hilton |
| 2009/0153437 A1 | 6/2009 | Aharoni |
| 2009/0228251 A1 | 9/2009 | Cakmakci et al. |
| 2010/0002154 A1 | 1/2010 | Hua |
| 2010/0060551 A1 | 3/2010 | Sugiyama et al. |
| 2010/0103075 A1 | 4/2010 | Kalaboukis et al. |
| 2010/0103196 A1 | 4/2010 | Kumar et al. |
| 2010/0149073 A1 | 6/2010 | Chaum et al. |
| 2010/0171680 A1 | 7/2010 | Lapidot et al. |
| 2010/0214635 A1 | 8/2010 | Sasaki et al. |
| 2010/0238161 A1 | 9/2010 | Varga et al. |
| 2010/0245387 A1 | 9/2010 | Bachelder et al. |
| 2010/0321409 A1 | 12/2010 | Komori et al. |
| 2011/0018903 A1 | 1/2011 | Lapstun et al. |
| 2011/0057863 A1 | 3/2011 | Sugihara et al. |
| 2011/0130636 A1 | 6/2011 | Daniel et al. |
| 2011/0202306 A1 * | 8/2011 | Eng et al. | 702/150 |
| 2011/0213664 A1 | 9/2011 | Osterhout et al. |
| 2011/0214082 A1 | 9/2011 | Osterhout et al. |
| 2011/0221656 A1 | 9/2011 | Haddick et al. |
| 2011/0221657 A1 | 9/2011 | Haddick et al. |
| 2011/0221658 A1 | 9/2011 | Haddick et al. |
| 2011/0221659 A1 | 9/2011 | King, III et al. |
| 2011/0221668 A1 | 9/2011 | Haddick et al. |
| 2011/0221669 A1 | 9/2011 | Shams et al. |
| 2011/0221670 A1 | 9/2011 | King, III et al. |
| 2011/0221671 A1 | 9/2011 | King, III et al. |
| 2011/0221672 A1 | 9/2011 | Osterhout et al. |
| 2011/0221793 A1 | 9/2011 | King, III et al. |
| 2011/0221896 A1 | 9/2011 | Haddick et al. |
| 2011/0221897 A1 | 9/2011 | Haddick et al. |
| 2011/0222745 A1 | 9/2011 | Osterhout et al. |
| 2011/0225536 A1 | 9/2011 | Shams et al. |
| 2011/0227812 A1 | 9/2011 | Haddick et al. |
| 2011/0227813 A1 | 9/2011 | Haddick et al. |
| 2011/0227820 A1 | 9/2011 | Haddick et al. |
| 2011/0231757 A1 | 9/2011 | Haddick et al. |
| 2011/0250962 A1 | 10/2011 | Feiner et al. |
| 2012/0120498 A1 * | 5/2012 | Harrison et al. | 359/630 |
| 2012/0120499 A1 * | 5/2012 | Harrison et al. | 359/631 |
| 2012/0154920 A1 * | 6/2012 | Harrison et al. | 359/619 |

FOREIGN PATENT DOCUMENTS

| | | |
|---|---|---|
| DE | 102007009828 A1 | 9/2008 |
| EP | 1418458 A1 | 5/2004 |
| GB | 2461907 A | 1/2010 |
| JP | 2002287077 A | 10/2002 |
| JP | 2006091477 A | 4/2006 |
| JP | 2008058461 A | 3/2008 |
| WO | 9722964 A1 | 6/1997 |
| WO | 2005017729 A2 | 2/2005 |
| WO | 2009066408 A1 | 5/2009 |
| WO | 2009094643 A2 | 7/2009 |
| WO | 2010123934 A1 | 10/2010 |
| WO | 2011114149 A1 | 9/2011 |
| WO | 2012052981 A2 | 4/2012 |
| WO | 2012083042 A1 | 6/2012 |

OTHER PUBLICATIONS

Jeon et al., "Mosaicing a Wide Geometric Field of View for Effective Interaction in Augmented Reality,"Mixed and Augmented Reality, 6th IEEE and ACM International Symposium, Mar. 2007, pp. 265-266.

Cakmakci et al., "Optical Free-Form Surfaces in Off-Axis Head-Worn Display Design," Mixed and Augmented Reality, 7th IEEE/ACM International Symposium; Mar. 2008, pp. 29-32.

(56) References Cited

OTHER PUBLICATIONS

Yang et al., "Hybrid Diffractive-Refractive 67°-Diagonal Field of View Optical See-Through Head-Mounted Display," Institute of Modern Optics, Aug. 17, 2005, pp. 351-355, vol. 116, No. 7, Optik—Internat, Nankai University, Tianjin, China.

Takeda et al., "Design and Implementation of a Wide Field-of-View Head Mounted Projective Display," Journal of the Institute of Image Information and Television Engineers, Jun. 2009, pp. 794-800, vol. 63, No. 6, Institute of Image Information and Television Engineers, Osaka, Japan.

Nagahara et al., Wide Field of View Catadioptrical Head Mounted Display, Transactions of the Institute of Electronics, Information and Communication Engineers D-II Jan. 2005, pp. 95-104, vol. J88D-II, No. 1, Inst. Electron. Inf. & Commun. Eng, Japan.

Pratt, P. D., "Advanced Helmet Sight Reticle Assembly (AHRA)," Jul. 1976, p. 364, Honeywell Inc., Minneapolis Minn. Systems and Research Div.

Nagahara et al., "Wide Field of View Head Mounted Display for Tele-Presence with An Omnidirectional Image Sensor," Computer Vision and Pattern Recognition Workshop, Jun. 16-22, 2003, vol. 7, p. 86.

Takeda et al., "Poster: A Virtual Walkthrough System with a Wide Field-of-View Stereo Head Mounted Projective Display," 3D User Interfaces, IEEE Symposium, Mar. 14-15, 2009, p. 149, Lafayette, LA.

Mori et al., "A Wide-View Parallax-Free Eye-Mark Recorder with a Hyperboloidal Half-Silvered Mirror and Appearance-Based Gaze Estimation," Visualization and Computer Graphics, IEEE Transactions, Aug. 26, 2010, p. 1, vol. PP, No. 99.

Okuma et al., "An Augmented Reality System Using a Real-Time Vision Based Registration," Pattern Recognition, 1998. Proceedings. Fourteenth International Conference, Aug. 16-20, 1998, p. 1226, vol. 2.

Parviz, Babak A., "Augmented Reality in a Contact Lens," IEEE Spectrum, Sep. 2009, http://spectrum.ieee.org/biomedical/bionics/augmented-reality-in-a-contact-lens/0.

Lingley et al., "A Single-Pixel Wireless Contact Lens Display," J. Micromech. Microeng., Nov. 22, 2011, 21 (2011) 125014 (8pp); doi:10.1088/0960-1317/21/12/125014; Received Jun. 9, 2011, in final form Sep. 19, 2011.

Vuzix High Resolution Video Eyewear—Products; Retrieved from http://www.vuzix.com/consumer; Retrieved Dec. 30, 2011.

Lumus—Consumer Market Products; Retrieved from http://www.lumus-optical.com/index.php?option=com_content&task=view&id=9&Itemid=15; Retrieved Dec. 30, 2011.

Head Mounted Displays from INITION; Retrieved from http://www.inition.co.uk/3D-Technologies/productsection/31; Retrieved on Dec. 30, 2011.

Azuma et al., "Improving Static and Dynamic Registration in an Optical See-Through HMD," Proc. of ACM SIGGRAPH 1994, Computer Graphics, Annual Conference Series, Orlando, FL, Jul. 24-29, 1994, pp. 197-204.

Cakmakci et al., "Meshfree Approximation Methods for Free-Form Surface Representation in Optical Design With Applications to Head-Worn Displays," Proc. of SPIE, 2008, vol. 7061, 70610D-1, http://www.creol.ucf.edu/Research/Publications/2012.pdf.

Hastings, A., "Eye Box Performance Parameters for Non Pupil Forming. Head/Helmet Mounted Displays," Tutorial, OPT 521, Dec. 6, 2006, www.optics.arizona.edu/optomech/.../tutorials/HastingsTutorial1.doc.

Hopkins et al., "Simple Thin Lens Optical Systems," US Department of Defense, Military Standardization Handbook: Optical Design, MIL-HDBK-141, Oct. 5, 1962, FSC-6650, Section 7, http://www.optics.arizona.edu/opti5101/references/mil-hdbk-141/ch7_12.pdf.

Klepper, Sebastian, "Augmented Reality—Display Systems," Technische Universitaet Muenchen, Munich, Germany, 2007, http://campar.in.tum.de/twiki/pub/Chair/TeachingSs07ArProseminar/1_Display-Systems_Klepper_Report.pdf.

Melzer et al. "Guidelines for HMD Design," in Helmet-Mounted Displays: Sensation, Pereption and Cognition Issues, C. E. Rash et al., ed., U.S. Army Aeromedical Research Laboratory, Fort Rucker, AL, 2009, Chapter 17, http://www.usaarl.army.mil/publications/hmd_book09/files/Section%2026%20-%20Chapter17%20Guidelines%20for%20HMD%20design.pdf.

Melzer, James E., "Head-Mounted Displays," The Avionics Handbook, Cary R. Spitzer, ed., CRC Press, Boca Raton FL, 2001, Chapter 5, http://www.davi.ws/avionics/TheAvionicsHandbook_Cap_5.pdf.

Nagahara et al., "Super Wide Viewer Using Catadioptric Optics," Proc. ACM Symposium on Virtual Reality Software and Technology (VRST2003), Oct. 2003, pp. 169-175, Osaka, Japan.

Nagahara et al., "Wide Field of View Catadioptrical Head-Mounted Display," Proc. of 2003 IEEE/RSJ, Intl. Conference on Intelligent Robots and Systems, Las Vegas NV, Oct. 2003, 3738-3743.

Livingston et al., "An Augmented Reality System for Military Operations in Urban Terrain," Proc of I/ITSEC '02, Orlando FL, Dec. 2-5, 2002.

Vanden Brook, T., "Device Helps Pinpoint Snipers: Technology Is Critical for U.S. Combat Troops," USA Today, Wednesday, Mar. 2, 2011.

Schwald et al., An Augmented Reality System for Training and Assistance to Maintenance in the Industrial Context, Journal of WSCG, Feb. 3-7, 2003, vol. 11, No. 1, Plzen, Czech Republic.

Rolland et al., "Development of Head-Mounted Projection Displays for Distributed, Collaborative, Augmented Reality Applications," Oct. 2005, Presence, vol. 14, No. 5, pp. 528-549.

Kato et al., "Marker Tracking and HMD Calibration for a Video-based Augmented Reality Conferencing System," 1999.

Kato et al., "Virtual Object Manipulation on a Table-Top AR Environment," 2000.

Billinghurst et al., "Collaboration with Tangible Augmented Reality Interfaces," 2002.

Liu et al., "An Optical See-Through Head Mounted Display with Addressable Focal Planes," IEEE Int'l Symposium on Mixed and Augmented Reality Sep. 15-18, 2008, Cambridge, UK.

Bayer et al., "Introduction to Helmet-Mounted Displays," 2009, U.S. Army Medical Dept., Medical Research and Material Command.

Rolland et al., "Invited Paper: Head-Worn Displays—Lens Design," 48th Annual SID Symposium, Seminar, and Exhibition 2010, Display Week 2010, May 23, 2010-May 28, 2010, vol. 2, pp. 855-858, Society for Information Display.

Spitzer et al., "Video I/O Interface for Wearable Computers," Proceedings of the SPIE—The International Society for Optical Engineering, vol. 3689, pp. 278-283, 1999, Conference: Helmet- and Head-Mounted Displays IV, Apr. 5-6, 1999, Orlando, FL, SPIE-Int. Soc. Opt. Eng, USA.

Upton et al., "Eyeglass Head-Up Display Vibrating Fiber Optic Assembly," 1981 SID International Symposium. Digest of Papers, Apr. 28-30, 1981, vol. XII, pp. 48-49, New York, NY, SID, Los Angeles, CA.

Rose, Melinda, "Microdisplays: Coming Soon to an Eye Near You?" Photonics Spectra, Sep. 2008, vol. 42, No. 9, pp. 68-69, Laurin Publishing Co. Inc.

Kurze et al., "Smart Glasses: An Open Environment for AR Apps," 2010 9th IEEE International Symposium on Mixed and Augmented Reality (ISMAR). Science & Technology Papers, Oct. 13-16, 2010, 313, 2010, Seoul, South Korea.

Schonlau et al., "Personal Viewer: A Wide-Field Low-Profile See-Through Eyewear Display," Proceedings of the SPIE—The International Society for Optical Engineering, Apr. 14-16, 2004, vol. 5443, No. 1, pp. 277-287, Orlando, FL, SPIE-Int. Soc. Opt. Eng.

Mukawa et al., "A Full Color Eyewear Display Using Holographic Planar Waveguides," IDW '08—Proceedings of the 15th International Display Workshops, Dec. 3, 2008-Dec. 5, 2008, vol. 1, pp. 259-262, Inst. of Image Information and Television Engineers.

Mukawa et al., "A Full-Color Eyewear Display Using Planar Waveguides with Reflection Volume Holograms," Journal of the Society for Information Display, vol. 17, No. 3, pp. 185-193, Mar. 2009, Society for Information Display.

Dejong, C. Dean, "Full-Color, See-Through, Daylight-Readable, Goggle-Mounted Display," Proceedings of SPIE—The International Society for Optical Engineering, Apr. 28, 2011-Apr. 28, 2011, vol. 8041, SPIE.

(56) References Cited

OTHER PUBLICATIONS von Waldkirch et al., "Spectacle-Based Design of Wearable See-Through Display for Accommodation-Free Viewing," Pervasive Computing. Second International Conference, PERVASIVE 2004. Proceedings. (Lecture Notes in Comput. Sci. vol. 3001), Apr. 18-23, 2004, 106-23, Springer-Verlag, Berlin, Germany.

Ayras et al., "Near-To-Eye Display Based on Retinal Scanning and a Diffractive Exitpupil Expander," Proceedings of SPIE—The International Society for Optical Engineering, Apr. 12, 2010-Apr. 15, 2010, vol. 7723, No. 77230V, SPIE.

Ferscha et al., "Wearable Displays for Everyone!" IEEE Pervasive Computing, Jan.-Mar. 2010, vol. 9, No. 1, pp. 7-10, Institute of Electrical and Electronics Engineers Inc.

"SEOS Ultra Wide Field-of-View Head Mounted Display," http://cgsd.com/SEOSHMD/, Jan. 3, 2003.

International Search Report, May 16, 2012.

Amery, John G. et al., "Flight Simulation Visual Requirements and a New Display System," Cockpit Displays VI: Displays for Defense Applications, Proceedings of the SPIE, vol. 3690, Aug. 16, 1999, 16 pages.

Author Unknown, "ABI Research Anticipated 'Dramatic Growth' for Augmented Reality via Smartphones," Human-Machine Technology Research Service, ABI Research, Oct. 22, 2009, 1 page.

Holden, Windsor, "A New Reality for Mobile," Whitepaper, Juniper Research Limited, Feb. 2011, 5 pages.

Author Unknown, "Immersive Displays: Powerwall, CAVE, Headmounted Displays (HMD)," InterSense Applications, Downloaded at http://www.intersense.com/categories/11/, Accessed on Mar. 7, 2011, InterSense Incorporated, 3 pages.

Feiner, Steven, et al., "MARS—Mobile Augmented Reality Systems", Columbia University, Computer Graphics and User Interfaces Lab, Downloaded at http://graphics.cs.columbia.edu/projects/mars/, Accessed on Mar. 7, 2011, 4 pages.

Haun, Bzur, "Gartner: Mobility market will reach $1 trillion by 2014," Mobility Management News and Blogs, Visage Mobile, Oct. 21, 2010, 2 pages.

Henderson, Steve, et al., "Augmented Reality for Maintenance and Repair (ARMAR)," Columbia University, Computer Graphics and User Interfaces Lab, Downloaded at http://graphics.cs.columbia.edu/projects/armar/, Jul. 2007, 4 pages.

Perey, Christine, et al., "Where's the Money? Mobile AR Revenue Streams," Mobile AR Summit Position Paper, Downloaded at http://www.perey.com/MobileARSummit/PEREY-Mobile%20AR-Revenue-Streams.pdf, Feb. 9, 2010, 4 pages.

Written Opinion of the International Searching Authority for PCT/IB2011/055824 mailed May 2, 2013, 5 pages.

International Preliminary Report on Patentability for PCT/IB2011/055824 mailed May 2, 2013, 7 pages.

International Search Report for PCT/IB2011/055820 mailed May 21, 2012, 4 pages.

International Search Report and Written Opinion for PCT/US2011/065201 mailed Mar. 7, 2012, 14 pages.

International Preliminary Report on Patentability for PCT/US2011/065201 mailed Jun. 27, 2013, 11 pages.

International Search Report for PCT/IB2011/055826 mailed Sep. 14, 2012, 4 pages.

International Preliminary Report on Patentability for PCT/IB2011/055826 mailed May 2, 2013, 11 pages.

Non-final Office Action for U.S. Appl. No. 13/211,365 mailed Oct. 24, 2012, 12 pages.

Final Office Action for U.S. Appl. No. 13/211,365 mailed Feb. 22, 2013, 15 pages.

Non-final Office Action and Examiner-Initiated Interview Summary for U.S. Appl. No. 13/211,365 mailed Jun. 14, 2013, 18 pages.

Final Office Action for U.S. Appl. No. 13/211,365 mailed Oct. 18, 2013, 22 pages.

Non-final Office Action for U.S. Appl. No. 13/211,372 mailed Nov. 21, 2012, 9 pages.

Non-final Office Action for U.S. Appl. No. 13/211,372 mailed Mar. 7, 2013, 12 pages.

Final Office Action for U.S. Appl. No. 13/211,372 mailed Aug. 1, 2013, 7 pages.

Notice of Allowance for U.S. Appl. No. 13/211,372 mailed Sep. 6, 2013, 8 pages.

Non-final Office Action for U.S. Appl. No. 13/327,217 mailed Jan. 17, 2014, 14 pages.

\* cited by examiner

METHODS AND SYSTEMS FOR CREATING FREE SPACE REFLECTIVE OPTICAL SURFACES

CROSS-REFERENCE TO RELATED APPLICATIONS

This application claims priority under 35 U.S.C. 119(e) to U.S. Provisional Application No. 61/405,440 (entitled HEAD-MOUNTED DISPLAY, filed Oct. 21, 2010), U.S. Provisional Application No. 61/417,325 (entitled CURVED-STACKED FRESNEL ARCHITECTURE, filed Nov. 26, 2010), U.S. Provisional Application No. 61/417,326 (entitled CURVED-BEAM SPLITTER ARCHITECTURE, filed Nov. 26, 2010), U.S. Provisional Application No. 61/417,327 (entitled COMBINED ARCHITECTURE OF FRESNEL LENSE AND FLAT BEAM SPLITTER, filed Nov. 26, 2010), U.S. Provisional Application No. 61/417,328 (entitled COMBINED ARCHITECTURE OF FRESNEL LENSE AND CURVED BEAM SPLITTER, filed Nov. 26, 2010), and U.S. Provisional Application No. 61/427,530 (entitled CURVED MIRROR FOR HEAD MOUNTED DISPLAY, filed Dec. 28, 2010), which are incorporated herein in their entireties by reference.

FIELD

This disclosure relates to methods and systems for creating (i.e., designing or designing and producing) free space reflective optical surfaces for use in head-mounted displays. More generally, the disclosure relates to methods and systems for creating free space optical surfaces for the display of imagery from a light-emitting display device held in close proximity to a user's eye.

The reflective optical surfaces are referred to herein as "free space" surfaces because the surface's local spatial positions, local surface curvatures, and local surface orientations are not tied to a particular substrate, such as the x-y plane, but rather, during the surface's design, are determined using fundamental optical principles (e.g., the Fermat and Hero least time principle) applied in three dimensional space.

BACKGROUND

A head-mounted display such as a helmet-mounted display or eyeglass-mounted display (abbreviated herein as a "HMD") is a display device worn on the head of an individual that has one or more small display devices located near one eye or, more commonly, both eyes of the user. FIG. 1 shows the basic elements of one type of HMD which includes a display 11, a reflective optical surface 13, and an eye 15 having a center of rotation 17. As shown in this figure, light 19 from display 11 is reflected by surface 13 and enters the user's eye 15.

Some HMDs display only simulated (computer-generated) images, as opposed to real-world images, and accordingly are often referred to as "virtual reality" or immersive HMDs. Other HMDs superimpose (combine) a simulated image upon a non-simulated, real-world image. The combination of non-simulated and simulated images allows the HMD user to view the world through, for example, a visor or eyepiece on which additional data relevant to the task to be performed is superimposed onto the forward field of view (FOV) of the user. This superposition is sometimes referred to as "augmented reality" or "mixed reality."

Combining a non-simulated, real-world view with a simulated image can be achieved using a partially-reflective/partially-transmissive optical surface (a "beam splitter") where the surface's reflectivity is used to display the simulated image as a virtual image (in the optical sense) and the surface's transmissivity is used to allow the user to view the real world directly (referred to as an "optical see-through system"). Combining a real-world view with a simulated image can also be done electronically by accepting video of a real world view from a camera and mixing it electronically with a simulated image using a combiner (referred to as a "video see-through system"). The combined image can then be presented to the user as a virtual image (in the optical sense) by means of a reflective optical surface, which in this case need not have transmissive properties.

From the foregoing, it can be seen that reflective optical surfaces can be used in HMDs which provide the user with: (i) a combination of a simulated image and a non-simulated, real world image, (ii) a combination of a simulated image and a video image of the real world, or (iii) purely simulated images. (The last case is often referred to as an "immersive" system.) In each of these cases, the reflective optical surface produces a virtual image (in the optical sense) that is viewed by the user. Historically, such reflective optical surfaces have been part of optical systems whose exit pupils have substantially limited not only the dynamic field of view available to the user, but also the static field of view. Specifically, to see the image produced by the optical system, the user needed to align his/her eye with the optical system's exit pupil and keep it so aligned, and even then, the image visible to the user would not cover the user's entire full static field of view, i.e., the prior optical systems used in HMDs that have employed reflective optical surfaces have been part of pupil-forming systems and thus have been exit-pupil-limited.

The reason the systems have been so limited is the fundamental fact that the human field of view is remarkably large. Thus, the static field of view of a human eye, including both the eye's foveal and peripheral vision, is on the order of ~150° in the horizontal direction and on the order of ~130° in the vertical direction. (For the purposes of this disclosure, 150 degrees will be used as the straight ahead static field of view of a nominal human eye.) Well-corrected optical systems having exit pupils capable of accommodating such a large static field of view are few and far between, and when they exist, they are expensive and bulky.

Moreover, the operational field of view of the human eye (dynamic field of view) is even larger since the eye can rotate about its center of rotation, i.e., the human brain can aim the human eye's foveal+peripheral field of view in different directions by changing the eye's direction of gaze. For a nominal eye, the vertical range of motion is on the order of ~40° up and ~60° down and the horizontal range of motion is on the order of ±~50° from straight ahead. For an exit pupil of the size produced by the types of optical systems previously used in HMDs, even a small rotation of the eye would substantially reduce what overlap there was between the eye's static field of view and the exit pupil and larger rotations would make the image disappear completely. Although theoretically possible, an exit pupil that would move in synchrony with the user's eye is impractical and would be prohibitively expensive.

In view of these properties of the human eye, there are three fields of view which are relevant in terms of providing an optical system which allows a user to view an image generated by an image display system in the same manner as he/she would view the natural world. The smallest of the three fields of view is that defined by the user's ability to rotate his/her eye and thus scan his/her fovea over the outside world. The maximum rotation is on the order of ±50° from straight ahead, so this field of view (the foveal dynamic field of view) is approximately 100°. The middle of the three fields of view is the straight ahead static field of view and includes both the user's foveal and peripheral vision. As discussed above, this field of view (the foveal+peripheral static field of view) is on the order of 150°. The largest of the three fields of view is that defined by the user's ability to rotate his/her eye and thus scan his/her foveal plus his/her peripheral vision over the outside world. Based on a maximum rotation on the order of ±50° and a foveal+peripheral static field of view on the order of 150°, this largest field of view (the foveal+peripheral dynamic field of view) is on the order of 200°. This increasing scale of fields of view from at least 100 degrees to at least 150 degrees and then to at least 200 degrees provides corresponding benefits to the user in terms of his/her ability to view images generated by an image display system in an intuitive and natural manner.

There thus exists a need for a reflective optical surface for use in a HMD that has improved compatibility with the field of view, both static and dynamic, of the human eye. There also exists a need for a reflective optical surface which can be used to provide virtual images (in the optical sense) to a human eye in a HMD without the limitations imposed by an external exit pupil. The present disclosure provides methods and systems for creating such surfaces.

DEFINITIONS

In the remainder of this disclosure and in the claims, the phrase "virtual image" is used in its optical sense, i.e., a virtual image is an image that is perceived to be coming from a particular place where in fact the light being perceived does not originate at that place.

Throughout this disclosure, the following phrases/terms shall have the following meanings/scope:
(1) The phrase "a reflective optical surface" (also referred to herein as a "reflective surface") shall include surfaces that are only reflective as well as surfaces that are both reflective and transmissive. In either case, the reflectivity can be only partial, i.e., part of the incident light can be transmitted through the surface. Likewise, when the surface is both reflective and transmissive, the reflectivity and/or the transmissivity can be partial.
(2) The phrase "field of view" and its abbreviation FOV refer to the "apparent" field of view in image (eye) space as opposed to the "real" field of view in object (i.e., display) space.

SUMMARY

In accordance with an aspect, a computer-based method for designing a free space reflective optical surface for use in a head-mounted display that reflects a virtual image of a display surface for viewing at a preselected spatial location by a user's eye is disclosed. The method comprises using one or more computers to perform the step of representing, by the one or more computers, the display surface by a plurality of display objects. The method also comprises using one or more computers to perform the step of representing, by the one or more computers, the free space reflective optical surface by a plurality of surface elements, each surface element being characterized by (i) a spatial location relative to the display surface, a nominal user's eye, and the preselected spatial location of the virtual image, (ii) a normal, and (iii) a radius of curvature. The method also comprises using one or more computer to perform the step of associating, by the one or more computers, each display object with at least one surface element in the direction of which a virtual image of the display object at the preselected spatial location will be displayed to the nominal user's eye, each surface element being associated with a single display object. For each surface element, an initial spatial location of the element is defined. For each surface element, an initial direction of the element's normal using the element's initial spatial location, the location of the display object with which the element is associated, and the location of a center of rotation of the nominal user's eye so that light from the display object that reflects off of the element will pass through said center of rotation is calculated, by the one or more computers. For each surface element, an initial radius of curvature for the element so that the virtual image of the display object is at the preselected spatial location is calculated, by the one or more computers. For each surface element, a final spatial location of the element, a final direction of the element's normal, and a final radius of curvature for the element and a set of surrounding elements by iteratively adjusting the spatial locations of the elements until an error function satisfies a predetermined criterion is calculated by the one or more computers.

In another aspect, the aforementioned method may be part of a system comprising a processor and a memory unit coupled to the processor where there the memory unit stores a computer program which includes programming instructions for performing the aforementioned method.

In another aspect, a computer program embodied in a tangible computer medium may be provided for performing the aforementioned method.

In another aspect, a computer-based method for designing a free space reflective optical surface for use in a head-mounted display that reflects a virtual image of a display surface for viewing by a user's eye is provided. The method comprises using one or more computers to perform the step of representing, by the one or more computers, the display surface by a plurality of display objects. The method comprises using one or more computers to perform the step of representing, by the one or more computers, the free space reflective optical surface by a plurality of surface elements. The method comprises using one or more computers to perform the step of iteratively calculating, by the one or more computers, at least a spatial location and at least a normal for each surface element of the plurality of surface elements which will cause a virtual image of each display object to be displayed to a nominal user's eye in a desired direction of gaze of the eye for that display object.

In another aspect, the aforementioned method disclosed in the paragraph above may be part of a system comprising a processor and a memory unit coupled to the processor where there the memory unit stores a computer program which includes programming instructions for performing the aforementioned method.

In another aspect, a computer program embodied in a tangible computer medium may be provided for performing the aforementioned method disclosed two paragraphs above.

DETAILED DESCRIPTION

Figure 1:
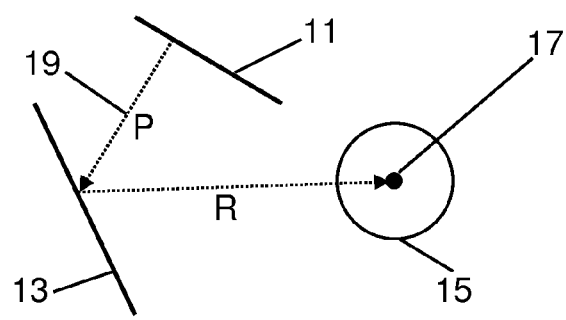
FIG. 1 is a schematic diagram showing basic components of a HMD, i.e., a display, a reflective surface, and a user's eye.

Reference will be made below in detail to embodiments, which are illustrated in the accompanying drawings. Wherever possible, the same reference numerals used throughout the drawings refer to the same or like parts. The accompanying drawings are included to provide a further understanding of the invention, and are incorporated in and constitute a part of this specification. It is to be understood that the various features of the embodiments disclosed in this specification and in the drawings can be used in any and all combinations.

In order for a human to focus on an object that is closer than approximately 25 centimeters, it is generally necessary to adjust the optical properties of the light that is being emitted from the object. One way to adjust the optical properties of the light so that it is focusable by the human eye is to collimate the light, resulting in light that has parallel beams and a flat wavefront. The wavefront of light leaving a point source has a spherical shape and its curvature can be defined by a property called vergence, or V. Vergence is measured in diopters [D], where the amount of vergence is determined by the distance, in meters, from the source of light. So, if the observer is a distance "s" [m] from a point source, the vergence is:

$$V = -\frac{1}{s[m]}[D] \quad \text{Eq. (1)}$$

That is, the vergence is equal to the inverse of the distance "s" from the point source, and has units [D] for diopters. It is shown as negative since that is the standard representation to indicate that the light rays are diverging.

In general, humans cannot adapt their eyes to focus on things closer than 25 centimeters. This is sometimes called the "near point." Thus the vergence at the adaptation limit, Va, is:

$$V_a = -\frac{1}{0.25[m]} = -4[D] \quad \text{Eq. (2)}$$

Accordingly, if the vergence is more divergent than −4 D, such as when a non-optically-corrected object is closer than 25 cm, the eye cannot focus on it.

One of the goals of certain embodiments of the free-space reflective optical surfaces disclosed herein is that the vergence of all the light entering the eye after reflection from the surface has a negative vergence closer to zero then $V_a$. Because the eye also cannot focus on light having a vergence greater than zero, another goal of those embodiments is that the distance to the virtual image of the object not go beyond infinity, so the vergence must be greater than zero, or $$V \geq -\frac{1}{\infty}[D],$$

essentially meaning $$V \leq 0 \text{ [D]}.$$

In order for the virtual image of the object to appear at a point farther away than 25 cm, the vergence to be achieved needs to be set to the inverse of the desired distance. For example, for a distance of 20 [m], the vergence of the light waves entering the eye is:

$$V = -1/20 = -0.05 \text{ [D]}.$$

And, for a distance of 50 [m] the vergence is:

$$V = -1/50 = -0.02 \text{ [D]}.$$

If a display is 25 cm away from the eye, the vergence of the display is:

$$V_a = -\frac{1}{0.25[m]} = -4[D]$$

and the eye can focus on it. If in FIG. 1, the display is on the user's forehead and the light rays are reflected off a reflective surface (mirror), the total distance, s, from a pixel on the display to the eye is:

$$s = s_P + s_R$$

where $s_P$ and $s_R$ indicate the length of line segments P and R in FIG. 1, respectively. It will be assumed that the display does not perform any collimation or change the optical properties of its emitted illumination. As discussed earlier, if there is no optical correction, the distance from the eye to the display must be greater than or equal to 25 cm.

Assume that it is desired to have the virtual images seem to be 50 [m] away from the center of the eye, then the vergence of the light entering the eye must be:

$$V_{50} = -\frac{1}{50[m]} = -0.02[D] \quad \text{Eq. (3)}$$

Figure 2:
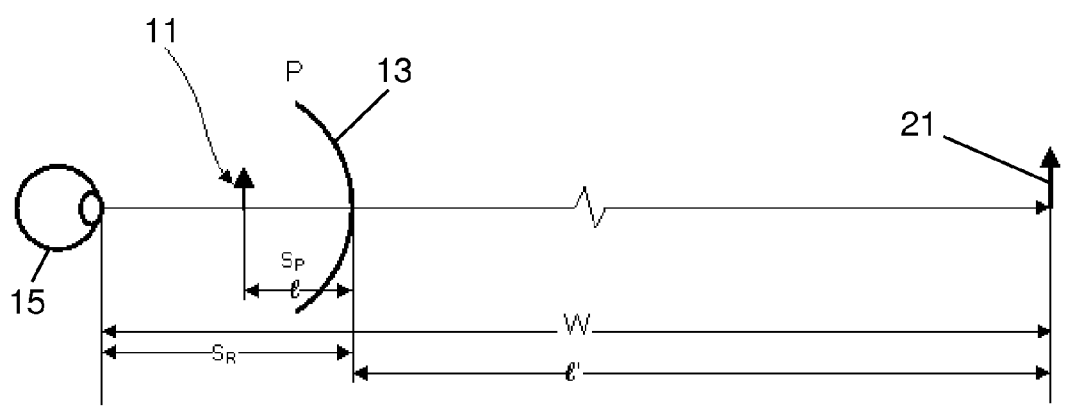
FIG. 2 is a schematic diagram showing the formation of a virtual image of an object (display) by a reflective surface and the parameters which determine the location and size of the virtual image.

To accomplish this, the reflective surface must converge the light that is emanating onto it as it directs the light into the eye. The amount of converging power, P, that the reflective surface must provide will vary depending on the distance from the display to the surface and to a lesser degree on the distance from the eye to the surface. FIG. 2 shows the relevant parameters where:

P=power of the concave reflector [D]
W=desired distance to the virtual image [m]
l=distance to object, in this case the object is a display object [m]
$s_P$=l=the distance from the display as shown by line segment P in FIG. 1 [m] (note that sp is negative, due to optical conventions and the reflection of the optical path by the mirror)
$s_R$=distance from reflector to eye, as shown by line segment R in FIG. 1 [m]
l'=distance to image 21, in this case a virtual image, from the surface of the reflector [m]

From FIG. 2 it can be seen that:

$$l' = W - s_R \quad \text{Eq. (4)}$$

The vergence associated with distance l' is:

$$L' = -\frac{1}{l'} = -\frac{1}{W - s_R} \quad \text{Eq. (5)}$$

From the Gaussian mirror equation, $$L = L' - P = -\frac{1}{W - s_R} - P \quad \text{Eq. (6)}$$

where L is the vergence associated with the distance l from the display to the reflector which is:

$$l = \frac{1}{L} = \left(-\frac{1}{W - s_R} - P\right)^{-1} \quad \text{Eq. (7)}$$

For completeness, the lateral magnification of the image is $$m = \frac{L}{L'} = 1 + P(W - s_R) \quad \text{Eq. (8)}$$

An example of the calculation is as follows where a concave mirror of focal length 35 mm is assume to be placed 30 mm from the eye and a display distance of 34.976 mm is calculated as the distance l which will produce a virtual image that will appear to be 50 meters form the user's eye. The example uses Mathcad nomenclature.

fl:=35 mm
fl=0.035 m
Radius:=2fl=0.07 m
P:=1/fl=28.571 $m^{-1}$
W:=50 m desired distance to the virtual image
sr:=30 mm distance from eye to reflector
elp:=W−sr=49.97 m
Lp:=−1/elp=−0.0200120072 $m^{-1}$
L:=Lp−P=−28.591 $m^{-1}$
el:=1/L=−0.035 m (note, el=sp)
el:=−34.976 mm
m:=L/Lp=1.42871429×$10^3$ Instead of calculating the location of the display given the power of the reflector, the location of the eye, and the location of the virtual image, the above analysis can be used to calculate the power of the reflector, given the distance to the display and the eye, and the desired distance to the virtual image. From Eq. (6) it can be seen that:

$$P = L' - L \quad (9)$$

Substituting in for L' and L from Eq. (5) and Eq. (7) gives:

$$P = -\frac{1}{W - s_R} - \frac{1}{l} \quad \text{Eq. (10)}$$

Since l=$s_P$, Eq. (10) becomes $$P = -\frac{1}{W - s_R} - \frac{1}{s_P} = \frac{s_R - s_P - W}{s_P(W - s_R)} \quad \text{Eq. (11)}$$

As an example, if the desired image distance, W, is 50 [m], the reflector is 40 mm from the eye, and the display is 40 mm from the reflector, the reflector power needs to be P=24.98 [D], i.e., [0.04−(−0.04)−50]/[−0.04(50−0.04)]. Note that $s_p$ is negative.

Thus, for a given orientation of the display, distance to the surface of the reflector, and distance from the reflector to the eye, the correct reflector power can be determined. In a concave spherical reflector, the power is $$P = \frac{1}{f} \quad \text{Eq. (12)}$$

where f is the focal length in meters [m]. In the spherical mirror, the focal length is related to the radius of curvature, r, as $$r = 2f \quad (13)$$

and hence $$r = \frac{2}{P} \quad \text{Eq. (14)}$$

So, to obtain the desired power as calculated from Eq. (11), it is necessary to ensure that the surface has the curvature specified by the radius calculation of Eq. (14).

If the display was a simple point source, the reflector requirements could be satisfied by a spherical concave reflector, but the display is generally a planar device with a grid of light emitting picture elements or pixels that cause the geometry to deviate from that which can be accomplished with a sphere. Also, as discussed above, it is desired to spread the light out over a larger area to obtain a wider field of view, e.g., a field of view capable of taking advantage of the wide field of view of the human eye (static and/or static+dynamic).

Figure 3:
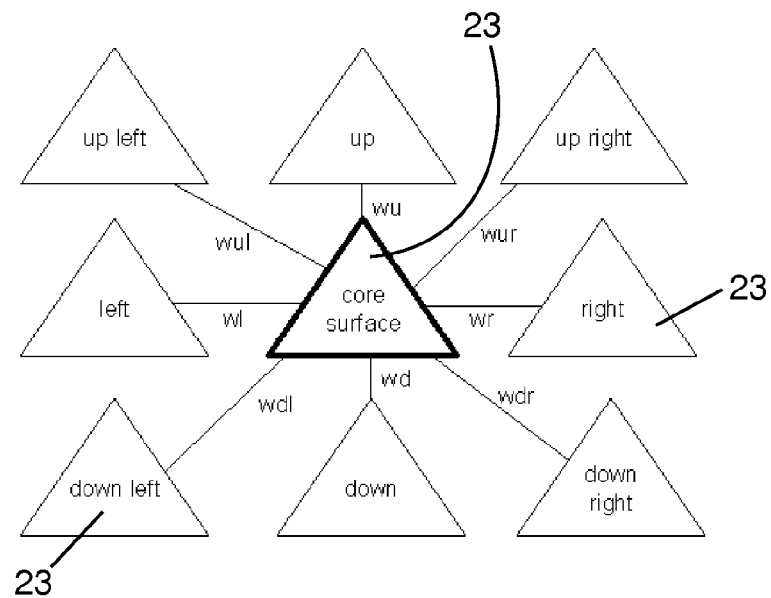
FIG. 3 is a schematic diagram illustrating a core surface element and its neighboring surface elements.

In accordance with the present disclosure, these challenges are met by dividing the reflective surface into a plurality (e.g., thousands) of surface elements 23, and adapting (adjusting) their positions, orientations, and curvatures to obtain desired reflector properties. Triangularly-shaped surface elements have been found to work successfully in the optimization, although other shapes can be used if desired. An example of a subset of surface elements 23 is shown in FIG. 3, where a core surface element has eight surrounding surface elements, and these all must exist in a relationship to one another in order to satisfy the optical property requirements for the overall reflective surface. Weights are shown emanating from the core surface element to the surrounding surface elements, and these are intended to allow a certain amount of influence to attend to certain surface elements more than others if needed, such as at an edge or corner (see below), where more influence is needed to move the surface, since there is less surrounding surface area to contribute, so the surface area that is there needs to contribute more adaptation motion influence.

The display surface, which may be flat or curved, is also divided into a plurality of pieces referred to herein as "display objects" or "virtual pixels." There may be just a few display objects (even just one large virtual pixel being theoretically possible) or thousands of virtual pixels arranged geographically across the display surface (the typical case).

In a computer system (see below), a display surface composed of display objects is created, an eye center is created, and an initial mesh of reflective surface elements is created. Then the reflective surface elements are all pointed, i.e., their normals are pointed, to allow reflection into the eye as per the Fermat Hero law (described later) such that the first derivative of the optical path length between the display object and the center of rotation of the eye will have a zero at the point on the reflector surface in whose direction it is desired to see the display object when the user looks towards the reflector surface.

The radii of curvature and spatial locations of the surface elements are then calculated as follows. First, for each core surface element corresponding to a particular display object of the display, the radius of curvature of the surface element needed to place the virtual image of that display object at the desired distance from the front of a nominal user's eye is calculated using the analysis set forth above. Then, the surrounding surface elements are checked to determine if they are in the right place in agreement with a superimposed sphere whose center lies on the normal to the core surface element (see below). If not, some or all of the surrounding surface elements are moved towards their correct positions for the display object (virtual pixel) and core surface element being considered. The process then moves on to other display object/core surface element combinations until all combinations have been updated. As discussed below, an error function is then calculated and a determination made if further iterations are needed.

Figure 4:
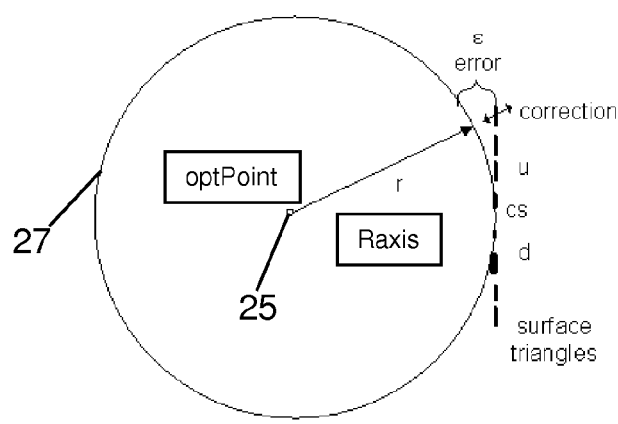
FIG. 4 is a schematic diagram illustrating a calculation of the error in the location of a surface element and the direction of movement of the surface element to reduce the error.

FIG. 4 shows a 2-dimensional illustration of the process by which the locations of the surrounding surface elements can be adjusted and an error function evaluated. In this figure, the optimum point (reference number 25) is at the center of a circle (reference number 27) whose radius, Raxis, is calculated in accordance with Eq. 16 below. In the 3-dimensional case, circle 27 would be a sphere and thus in the following discussion circle 27 will be referred to as sphere 27. Also, as discussed fully below, rather than having its center at, for example, the virtual pixel, sphere 27 will preferably have its center along the normal to the core surface element.

As shown in FIG. 4, the surface elements labeled u and d for up and down, as in FIG. 3, are not aligned to sphere 27. This is an error. Using these errors, an error function can be determine by summing the errors across the entire reflective surface $$E = \sum_{\text{all core surfaces}} \sum_{\text{all surrounding surfaces}} |\epsilon| \qquad \text{Eq. (15)}$$

where the individual errors, $\epsilon$, are calculated as the difference between the center of the surface element under consideration, such as surface element u in FIG. 4, and the location of the surface of sphere 27 at the intersection between the sphere and a line between the center of the sphere and the center of the surface element under consideration, e.g., the intersection of sphere 27 with a line from reference number 25 to the center of surface element u in FIG. 4.

Note that the center of the radius of the sphere used to move the surface elements and calculate errors preferably should be from a place where the radius of curvature of the core surface element would be parallel with (or, more specifically, lie along) the normal that is needed to provide the Fermat/Hero reflection. This point, called the optPoint, has a radius of:

$$\text{Raxis} = \frac{2}{P} = \frac{2s_p(W - s_r)}{s_r - s_p - W} \qquad \text{Eq. (16)}$$

for a current distance from the eye, $s_r$, and a current display object (virtual pixel), $s_p$. Note that $s_p$ is a negative number by optical convention since it is reflected light from the mirror. This radius is used by first locating the line that bisects the vectors from the current surface element's centroid to (a) the virtual pixel and (b) the center of rotation of the eye. The distance Raxis is then traversed upon this line in order to place a point, the optPoint, to use as the center of a sphere to use for error checking and for iterative correction of surface elements at each surface element. The method of determining and using Raxis is illustrated in FIG. 5.

Figure 5:
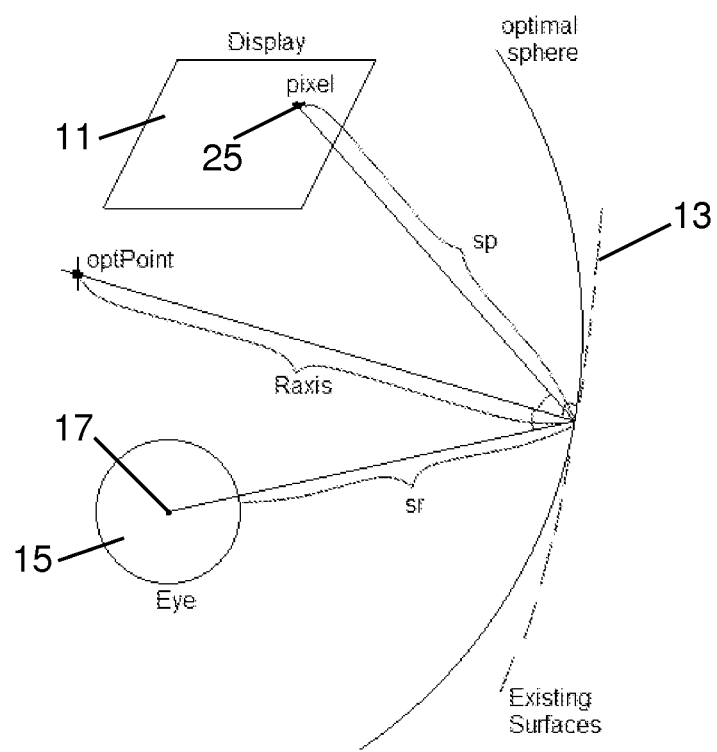
FIG. 5 is a schematic diagram illustrating how surface elements can be incrementally moved based upon optPoint/ virtual pixel/radius of curvature/$s_p$/$s_r$ sets.
Figure 6:
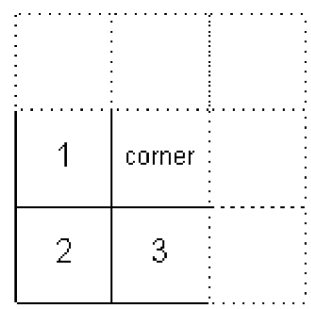
FIG. 6 is a schematic diagram showing a corner surface element.

The desired final configuration of the reflective surface is obtained by slowly moving the surface elements towards the optimal surface which, in this case of FIG. 5, is a spherical surface. Note that the spherical surface of FIG. 5 is only optimal for the specified combination of virtual pixel, eye center, and distant virtual image (not shown in FIG. 5). The current surface element is the surface element used to calculate Raxis and optPoint. There will be a different Raxis and optPoint for each core surface element. The surrounding surface elements are adjusted to start to get the correct radius of curvature, Raxis, defined for that display object (virtual pixel) and that core surface element. Then the next display object (virtual pixel) and core surface element are considered. This next core surface element can affect the surface elements just affected by the previous operation, which is why only a small amount of change is performed at each iteration. The objective is to minimize the error over the entire display surface. Alternatively, certain sections of the display surface can be made to have less error than others.

If there was only one display object (virtual pixel), the zero error surface would be a sphere of the correct radius to provide enough diopter power correction so that the image of the display object appeared to be at the desired distance, W, of Eq. (4). The eyepoint, $s_R$, can be included in the calculation, but makes very little difference when the collimation is such that the virtual image is expected to appear at 50 meters in front of the observer. It is included in the actual calculations, but only affects the fourth significant digit of the reflective surface calculations when W=50 [m].

Also, if there was only one or a few virtual pixels and there was a pupil to look through and the waveforms of light could be reasonably expected to be contained in an area near to and around an optical axis that goes through the optical instrument, then this system could be analyzed with paraxial techniques, such as might be used with a telescope or a camera lens. In this case though, as discussed above, there is no real non-biological optical axis, and the errors are detected and the system characterized with the techniques disclosed herein. Although classical and other techniques for measuring performance, e.g., the system's Modulation Transfer Function (MTF), can be included in the error function, the errors of performance over the whole field of view will be summed and reduced using an error function which includes errors of the type illustrated in Eq. (15). The magnitude of the total error that can be tolerated will, of course, depend on the particular application of the HMD and can readily be set by persons skilled in the art based on the present disclosure and the specifications which the HMD images need to satisfy.

It should be noted that the eye can deal with about 0.5 D of misfocus, and that can also be used as part of the error calculation, e.g., when a mean estimate of the radius of curvature of the reflective surface at each reflection point is determined after an optimization cycle has taken place. To enable a smooth transition of viewing all across the field of view, the reflective surface elements may be smoothly transitioned from one to another. For example, the smoothing may be performed by using Non-Uniform Rational B-Spline (NURBS) technology for splined surfaces, thus creating a smooth transition across the entire reflective optical surface.

The error surface discussed above is one metric upon which to determine improvement in and performance of the surface qualities. To then improve the surface reflection qualities, the individual surface elements are moved with respect to the error they contribute. This is illustrated in FIG. 4 by the double-sided arrow identified by the word "correction." The individual surface elements are moved in the direction to reduce the error for a given core surface element sphere. In certain embodiments, a rate variable, $\beta$=[0.1], that determines the amount of adjustment to make at each iteration is used so as to make sure that the surface elements move slowly enough. The spatial locations of all surrounding surface elements near the core surface element are adjusted and then the same is done at the next core surface element. As discussed above, various weightings of influence of the core surface element on the nearby surfaces elements can be employed, so that, for instance, surface elements near the corners or edges also get adjusted in a similar amount as those surface elements that are more fully surrounded by core surface elements that can supply incremental changes.

There are three types of patterns of surface elements: (1) those having all nine triangles existing; (2) those having one set of three triangles missing, such as at an edge; and (3) those where there are five triangles missing as would happen at a corner. In each case, cs is present; the difference is in the number of surrounding surface elements. In these cases, an affect weighting is used to allow the surface element's adaptation amount to be increased to be more commensurate with the adaptation that may happen in a situation where the surface element is surrounded by other surface elements.

In particular, at a corner, instead of being surrounded by eight surface elements, a given surface element is only surrounded by three surface elements, as shown in FIG. 5. Only three of the eight potential influencers are available to provide correction and, therefore, an affect weight of 8/3 is used to adjust the amount of correction each core surface element at positions 1, 2, or 3 can provide. This affect weight is multiplicative to the three dimensional movement that is already decreased by the rate, $\beta$. Similarly, the affect weight for a surface element at an edge is 8/5.

As the surface elements are moved, the surface curvature is controlled to obtain the correct power across the field of view with the changing distances between the surface elements, the display objects and the nominal user's eye. The normals of the surface elements are also adapted to ensure that the pointing angles of the areas of the display (the display objects) are correct.

It is important to be able to stretch the field of view across a wide angle to permit the user to see more information in their peripheral vision, and to be able to scan the display in a more natural manner.

The spot on a mirror where an image will appear has been known since the time of Fermat, Hero of Alexandria, and from additional follow-on work, the image has been shown to be at the points where the length of the optical path has reached a stable point, a maximum or minimum. This can be found by finding the zeros of the first derivative of the optical path length. For ease of presentation, it is assumed that the entire optical path is in air, it being understood that persons skilled in the art can readily adapt the disclosed methods to cases where all or part of the optical path is composed of one or more different optical materials. For instance, a circle of radius r centered at [x,y]=[0,0] has the following equation $$x^2+y^2=r^2 \quad (17)$$

Solving for x yields $$x=\pm\sqrt{r^2-y^2} \quad \text{Eq. (18)}$$

Figure 7:
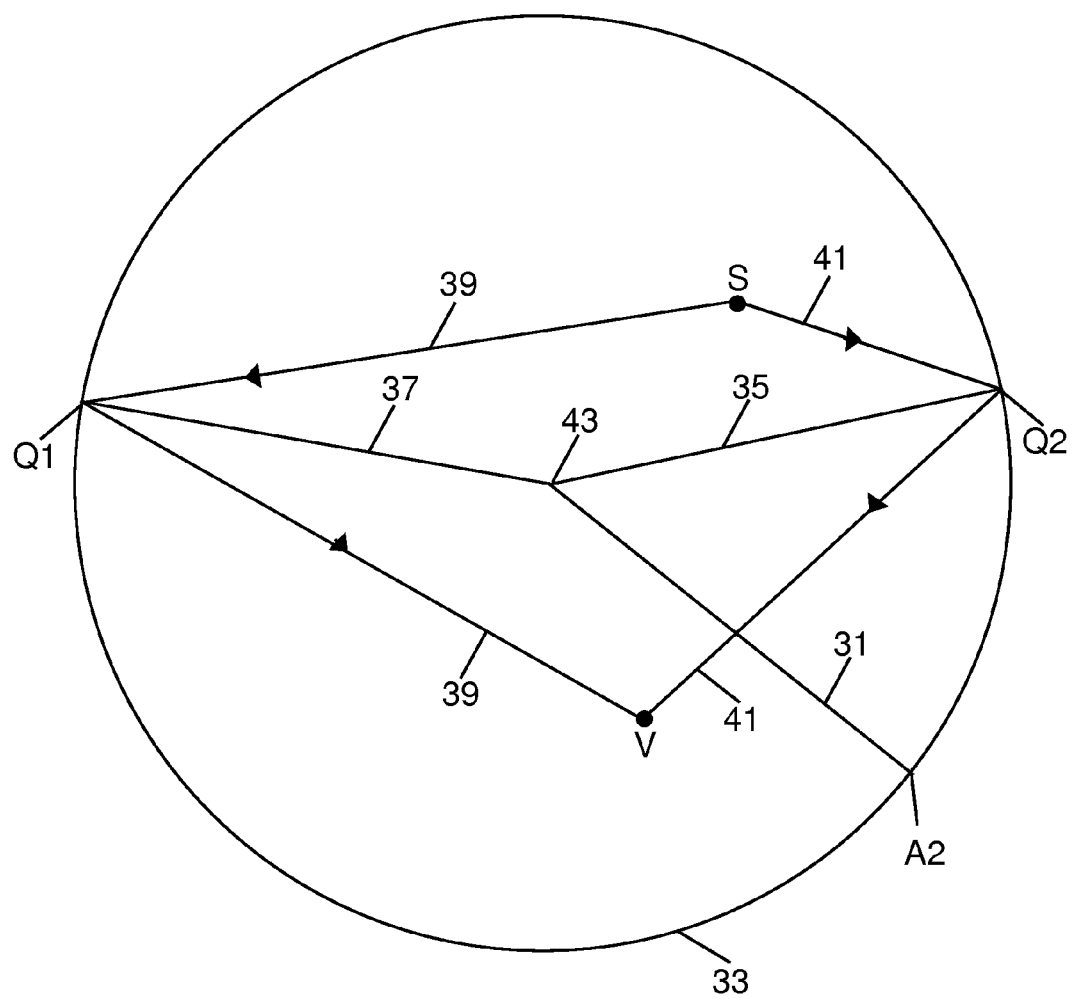
FIG. 7 is a schematic diagram illustrating two optical paths between a source S and a viewer V for a circular reflector.

Assuming a point source (S) having the coordinates $[x_S,y_S]$ and a view point (V) having the coordinates $[x_V,y_V]$ are in space around a spherical reflector in air, represented in this analysis as a circle 33 in FIG. 7 for example, the optical path, L, consists of the path length from the source point to the point on the surface where the image is seen at, Q, and the path length from Q to the view point, shown as $$L = \overline{VQ} + \overline{QS} \quad \text{Eq. (19)}$$

$$L = \sqrt{\left(\pm\sqrt{r^2-y^2}-x_v\right)^2+(y-y_v)^2} + \sqrt{\left(\pm\sqrt{r^2-y^2}-x_s\right)^2+(y-y_s)^2}$$

Taking the first partial differential of Eq. (19) with respect to y for the positive radical gives $$\frac{\partial L}{\partial y} = \frac{y-y_v+\frac{y(x_v-\sqrt{r^2-y^2})}{\sqrt{r^2-y^2}}}{\sqrt{\left(x_v-\sqrt{r^2-y^2}\right)^2+(y_v-y)^2}} + \frac{y-y_s+\frac{y(x_s-\sqrt{r^2-y^2})}{\sqrt{r^2-y^2}}}{\sqrt{\left(x_s-\sqrt{r^2-y^2}\right)^2+(e-y)^2}} \quad \text{Eq. (20)}$$

and using the negative radical term gives $$\frac{\partial L}{\partial y} = -\frac{y_v-y+\frac{y(x_v+\sqrt{r^2-y^2})}{\sqrt{r^2-y^2}}}{\sqrt{\left(x_v+\sqrt{r^2-y^2}\right)^2+(y_v-y)^2}} - \quad \text{Eq. (21)}$$

$$\frac{y_s - y + \frac{y(x_s + \sqrt{r^2 - y^2})}{\sqrt{r^2 - y^2}}}{\sqrt{(x_s + \sqrt{r^2 - y^2})^2 + (y_s - y)^2}}$$

The concept may be tested with some representative values. A pair of points is chosen in FIG. 7, and they are

V=[20, −50]

S=[40, 40]

and a circle 33 of radius 100 is centered at the origin 43.

The two points predicted from Eqs. (20) and (21) for y and Eq. (18) for x, using positive for the x value associated with the y value of Eq. (20), and negative for the x value associated with the y value of Eq. (21) are:

Q1=[−98.31, 18.276]

Q2=[97.685, 21.392]

These points are plotted in FIG. 7 where the light ray from the source S which reflects at Q1 is shown by the reference number 39 and that which reflects from Q2 is shown by reference number 41. It is seen that the lines from points V and S to Q1 or Q2 can be bisected by a line from the origin to the Q1 or Q2 point, i.e., lines 37 and 35, respectively. This is also a property of the core surface elements used herein, i.e., the angle between the viewer's eye and the display object being viewed is bisected by the normal of the core surface element. It is this property that is exploited in moving the surface elements off of a simple spherical surface to prescribed free-space locations that are created by angling the surface normal to be such that it will bisect a vector between the viewer's eye and the display object desired to be viewed. This orientation of the surface elements can, for example, be performed using the method of quaternions to rotate the surface element to an orientation that is halfway between the rotation that defines the vector to the viewer and the vector that defines the vector to the display object being viewed.

For instance, there is an additional line 31 from the center 43 of the circle 33 to the edge of the circle in FIG. 7. It indicates another point A2 on the reflective surface where it may be desired to display the image from point S. If the surface at that point is made to have a surface normal that bisects the vectors to V and S, then the image of S will appear at V when the observer at V looks in the direction of the new point on the surface.

Figure 8:
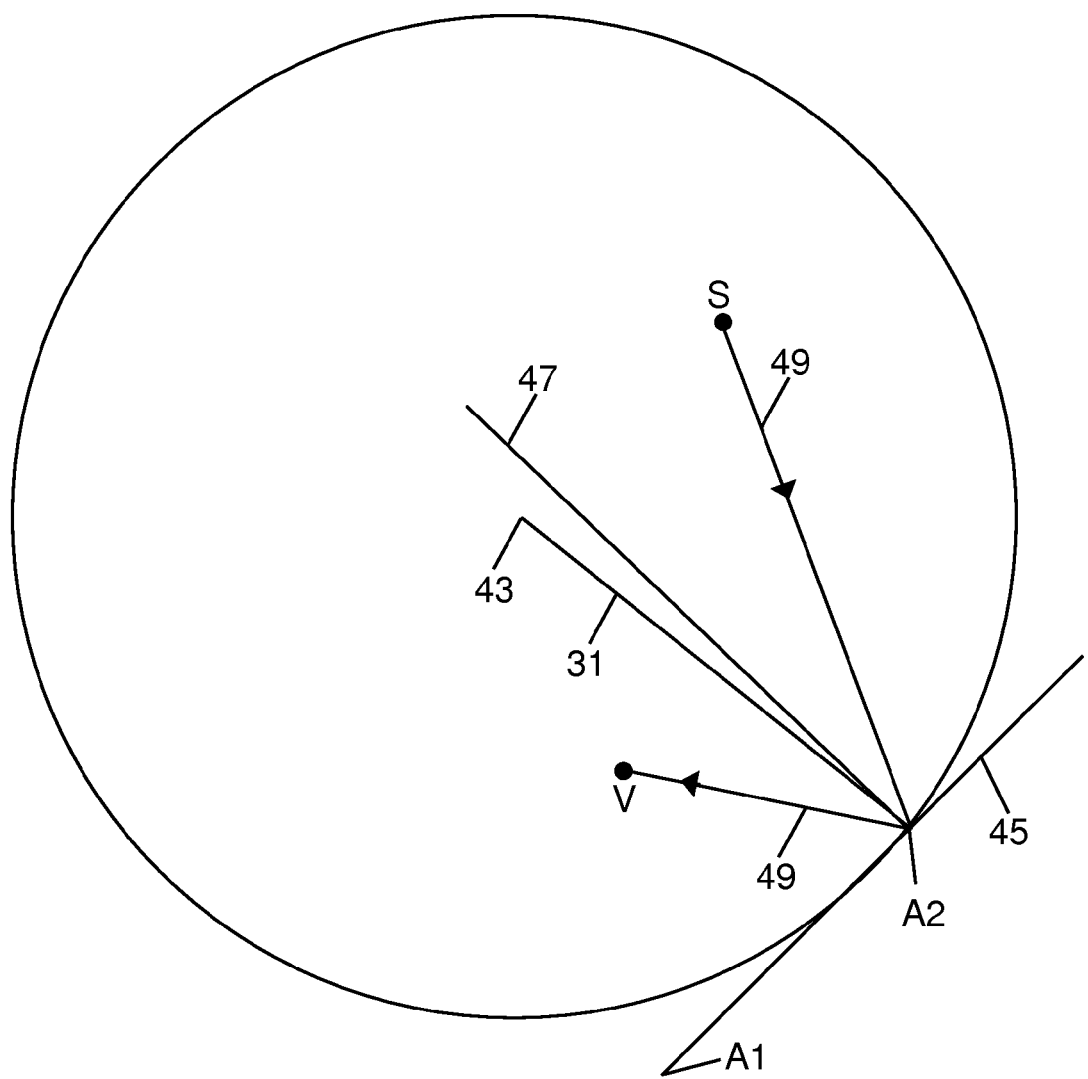
FIG. 8 is a schematic diagram illustrating a single optical path between a source S and a viewer V for a planar surface having a normal which does not lie along a radius of a sphere.

This is further illustrated in FIG. 8. In this figure, a line 45 has been drawn at point A2, that provides a normal 47 that bisects the vectors from A2 to S and V. Another point, A1, was put on the line 45 and manually measured to allow a point slope formula equation for the line 45 to be made, from which an equation for x in terms of y was obtained.

$A_1 = [45, -100]$ $A_2 = [78, -62.85]$ $y = mx + b$ $m = \frac{-62.85 - 100}{78 - 45} 78 - 45 = \frac{37.154}{33} = 1.12576$ $b = y - mx = -100 - m(45) = -150.6591$ Thus $x = \frac{y - b}{m} = \frac{y + 150.6591}{1.12576}$ With the optical path length = $L = \overline{SA_2} + \overline{A_2V}$ or $$L = \sqrt{\left(x_s - \frac{y-b}{m}\right)^2 + (y_s - y)^2} + \sqrt{\left(x_v - \frac{y-b}{m}\right)^2 + (y_v - y)^2}$$

and $$\frac{\partial L}{\partial y} = -\frac{y_s - y + \frac{\left(x_s + \frac{b-y}{m}\right)}{m}}{\sqrt{\left(x_s + \frac{b-y}{m}\right)^2 + (y - y_s)^2}} - \frac{y_v - y + \frac{\left(x_v + \frac{b-y}{m}\right)}{m}}{\sqrt{\left(x_v + \frac{b-y}{m}\right)^2 + (y - y_v)^2}}$$

Figure 9:
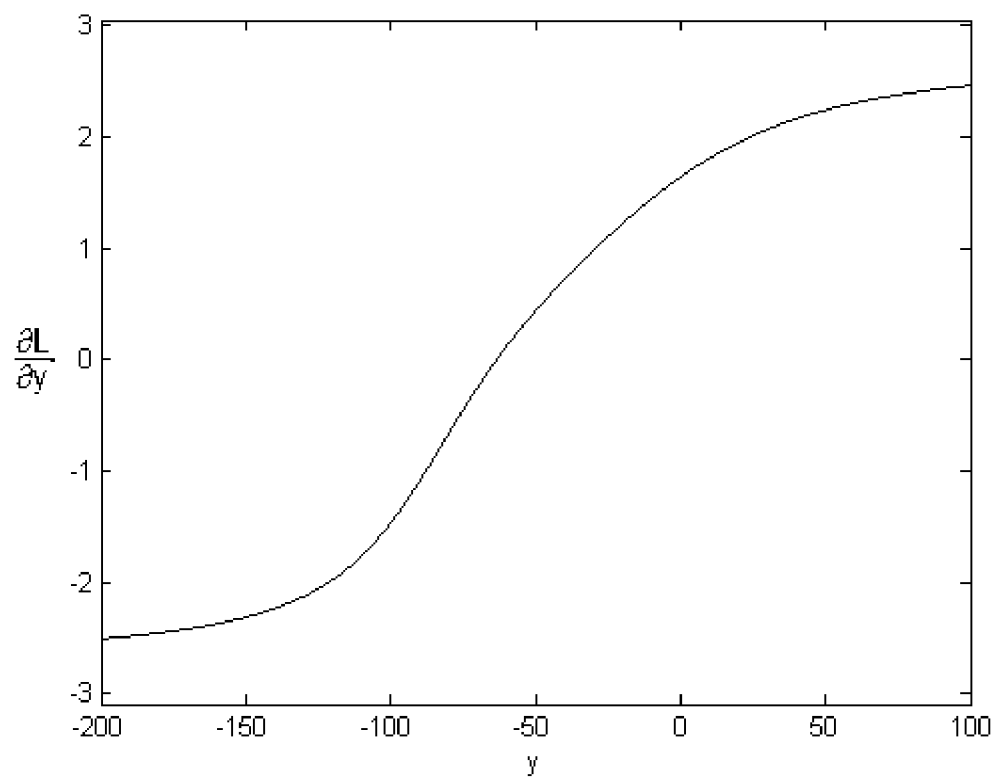
FIG. 9 is a graph showing that the first derivative of the optical path length between S and V of FIG. 8 has only one zero, indicating the point of optical path stability.

Over the range of y=[−200 . . . 100] this partial derivative only has one zero, at y=−63.4828, corresponding to an x value of 77.49, which is at the expected location where the line touches the circular curve. FIG. 9 is a graph of the partial derivative of the optical path length for line 45 with respect to the y-coordinate of the line. As can be seen, the graph has only one zero.

It is important to note that line 45 is not a tangent line to circle 33. It has a different slope, having a normal that bisects the vectors from A2 to the eyepoint V and the display object at S. This is how the present disclosure is able to place images of individual virtual pixels or regions of a display in different areas of a viewing region, and how it serves to expand the field of view by iteratively adjusting the slope of the core surface elements and checking the errors of the surface elements and adjusting their locations until the errors are optically acceptable.

Returning to FIG. 7, it can be seen in this figure that images from a single point can appear at multiple points on a reflector, in this case on both sides of the circular reflector. Accordingly, it is desirable to conduct an analysis such as that performed in FIG. 9 so as to detect spurious duplication of imagery. Spurious imagery can also be detected with ray tracing. Ray tracing shows that only rays that hit at point Q1 or point Q2 will pass through V after leaving S. More generally, if any rays pass through V from a certain point such as S then the user can inspect where that ray came from. For example, one more ray that will be apparent from such an inspection is the ray directly through space from S to V. In the design of a HMD, this direct path can be physically blocked to cut down on internal light noise. Alternatively, the attainable field of view of the eye may naturally block spurious imagery.

Figure 10:
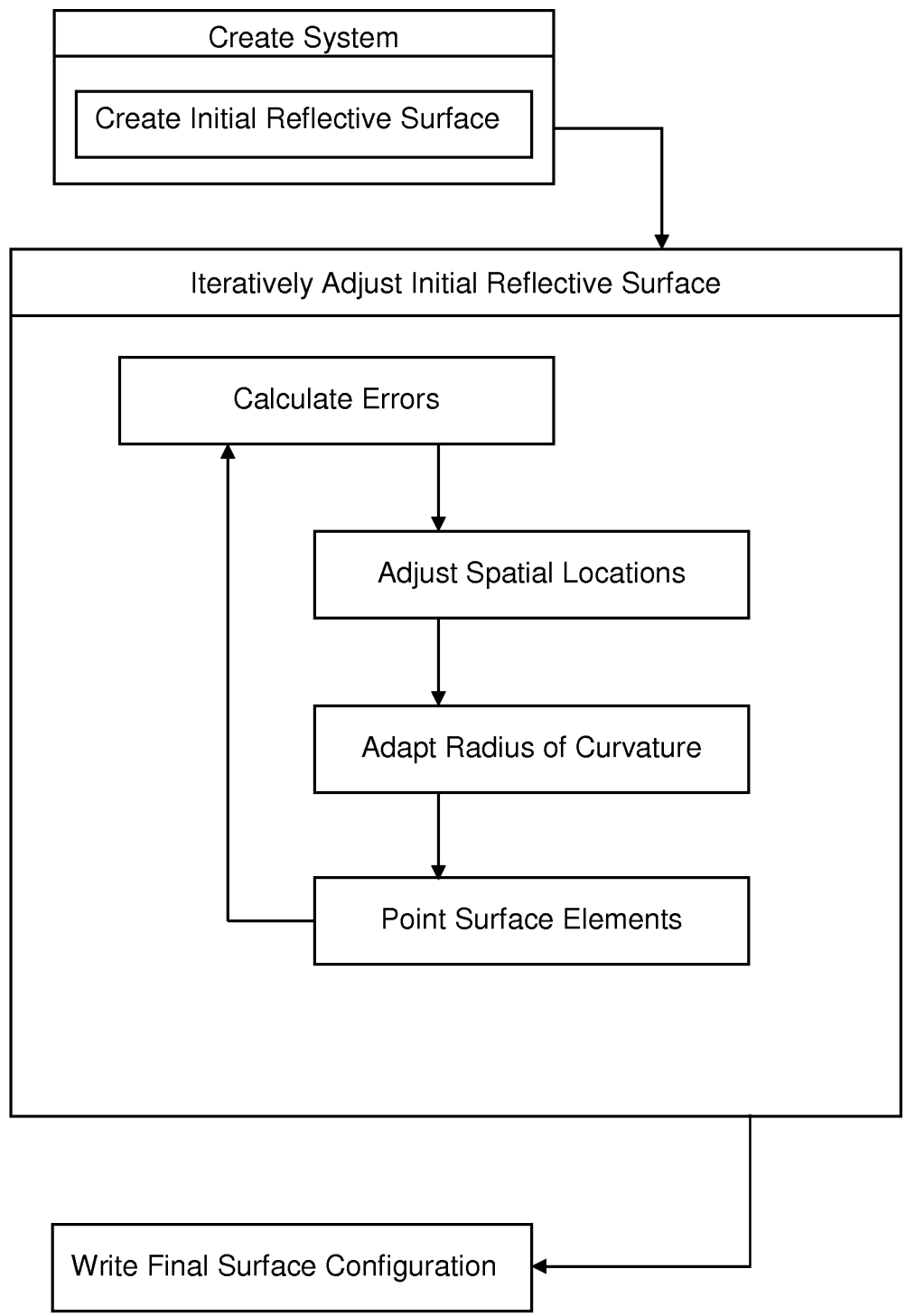
FIG. 10 is a flow chart illustrating an embodiment of the present disclosure.
Figure 11:
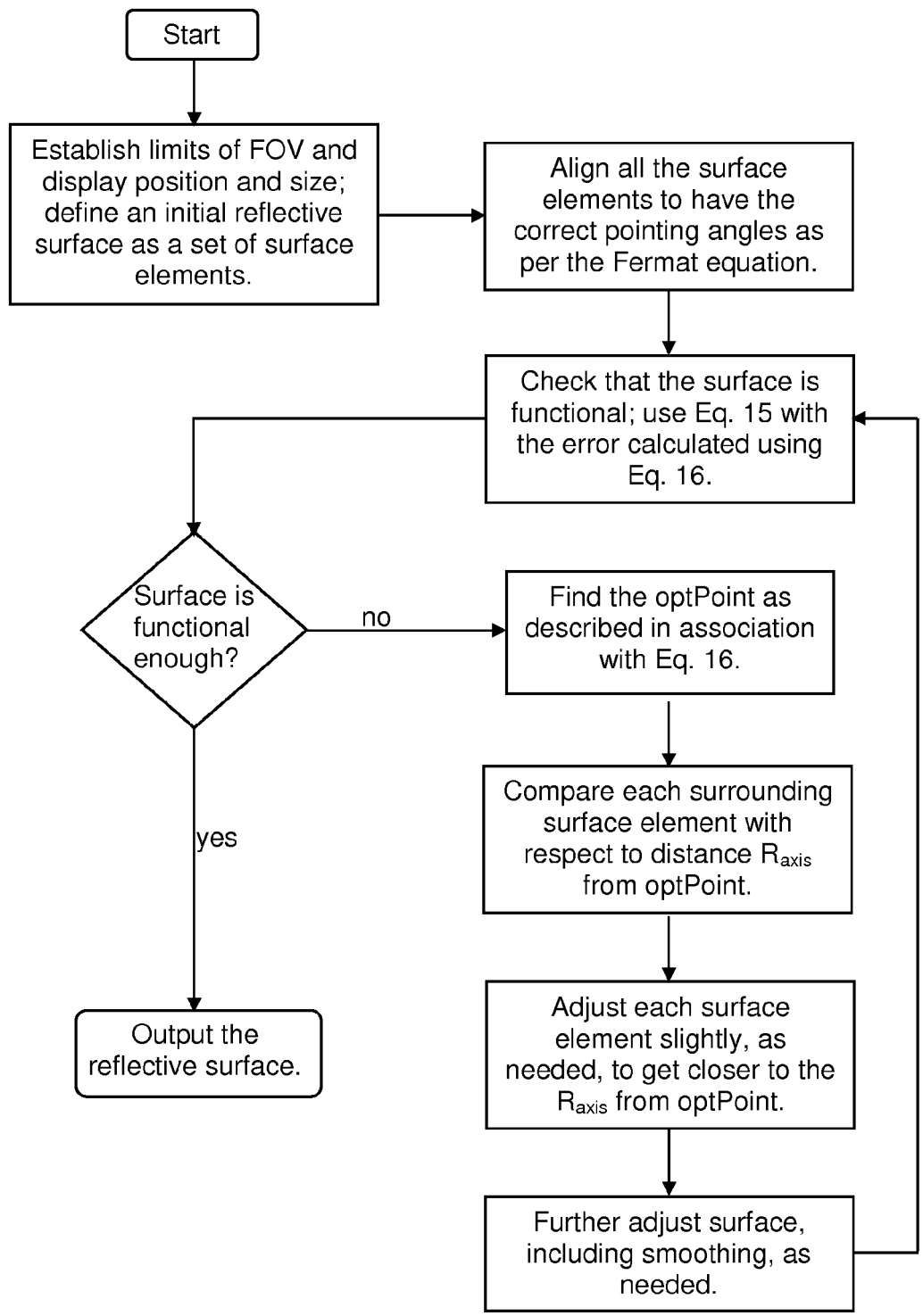
FIG. 11 is a flow chart illustrating another embodiment of the present disclosure.

FIGS. 10 and 11 are flow charts summarizing the above procedures for creating a reflective surface for use in a HMD. In particular, FIG. 10 shows the overall strategy of creating in one or more computers an overall system which includes an initial reflective surface and then iteratively adjusting the initial reflective surface by adjusting spatial locations of surface elements, adapting the radii of curvature of those elements, and pointing the surface elements in the desired directions. Errors are then calculated and used to determine if further iterations are needed or if a final surface configuration can be outputted. FIG. 11 describes an embodiment which employs Eqs. (15) and (16) discussed above.

In accordance with a specific embodiment of the procedures set forth in these figures, the iterative process uses a series of "on" surface elements. For a given "on" element, only the surrounding elements are adjusted at an iteration, following which, the system moves to the next element (the next "on" element) and adjusts its surrounding elements and so forth. The element that the system is "on" is not changed, only its neighbors are changed to better fit the surface of a sphere that touches the "on" element, and is centered at the "optPoint" for the "on" element. There is only one adjustment to each neighbor made at an iteration, and then the process moves on to the next "on" element and all its neighbors are adjusted once, until all surface elements have been made the "on" element. Then the global error is calculated, and if it is not low enough, the process repeats. The process does not repetitively adjust neighbor elements for one "on" element before moving on. Rather, the process makes one small adjustment to each neighbor as needed at each iteration, and then moves on to the next "on" element and its set of neighbors. The result of this iterative adjusting of the spatial locations of the surface elements is a final spatial location for each surface element, a final direction of each element's normal, and a final radius of curvature for each element and a set of surrounding elements. The final locations, normals, and radii of curvature are outputted, e.g., stored in memory, when the error function satisfies a predetermined criterion, e.g., when the error function is smaller than a predetermined value.

Figure 12:
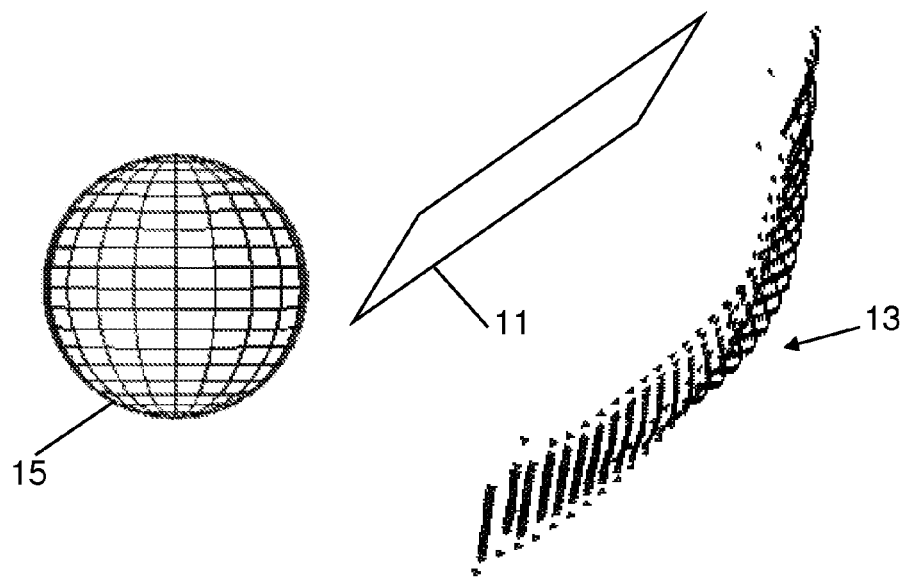
FIGS. 12 and 13 illustrate, from two perspectives, a reflective optical surface designed using the methods and systems disclosed herein.
Figure 13:
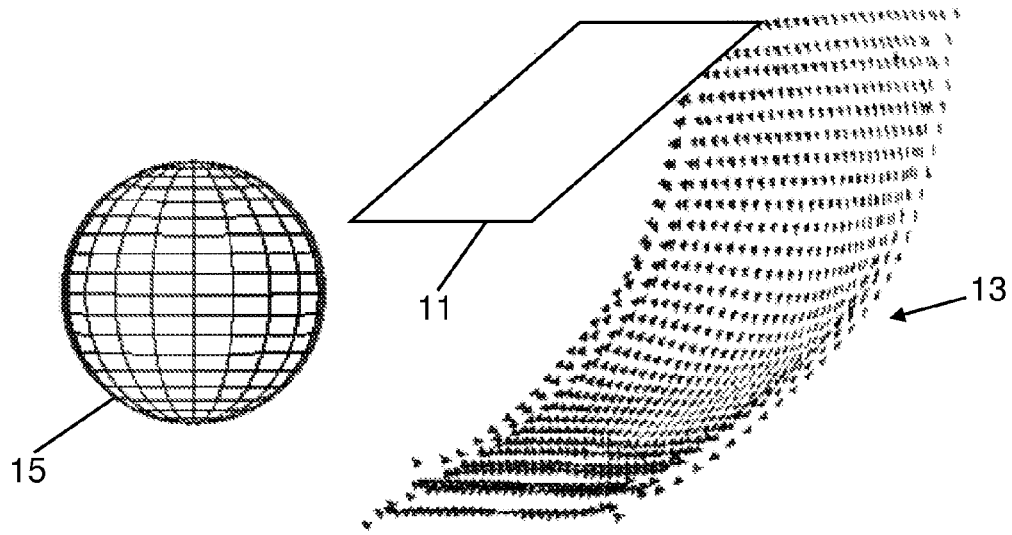
Figure 14:
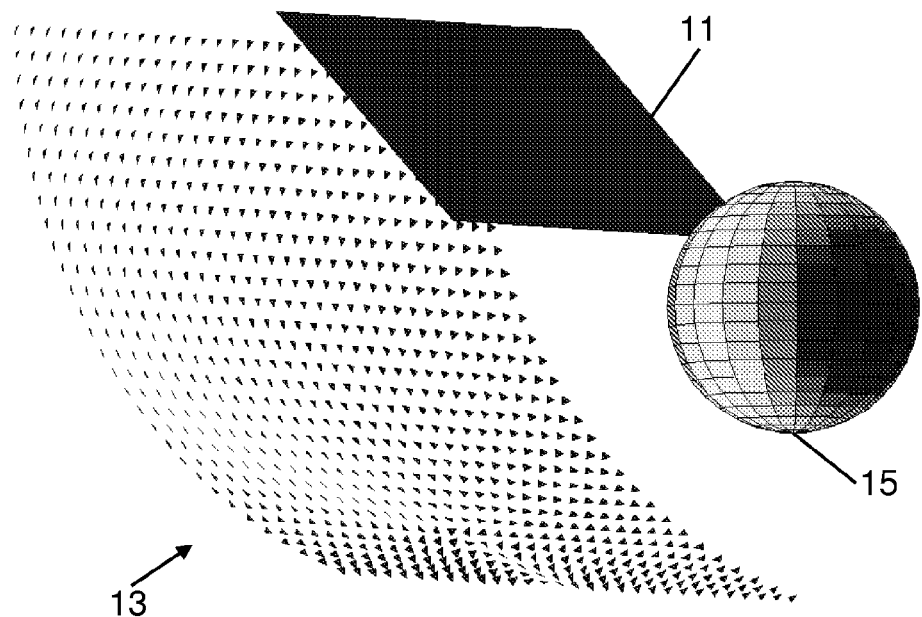
FIGS. 14 and 15 illustrate, from two perspectives, another reflective optical surface designed using the methods and systems disclosed herein.
Figure 15:
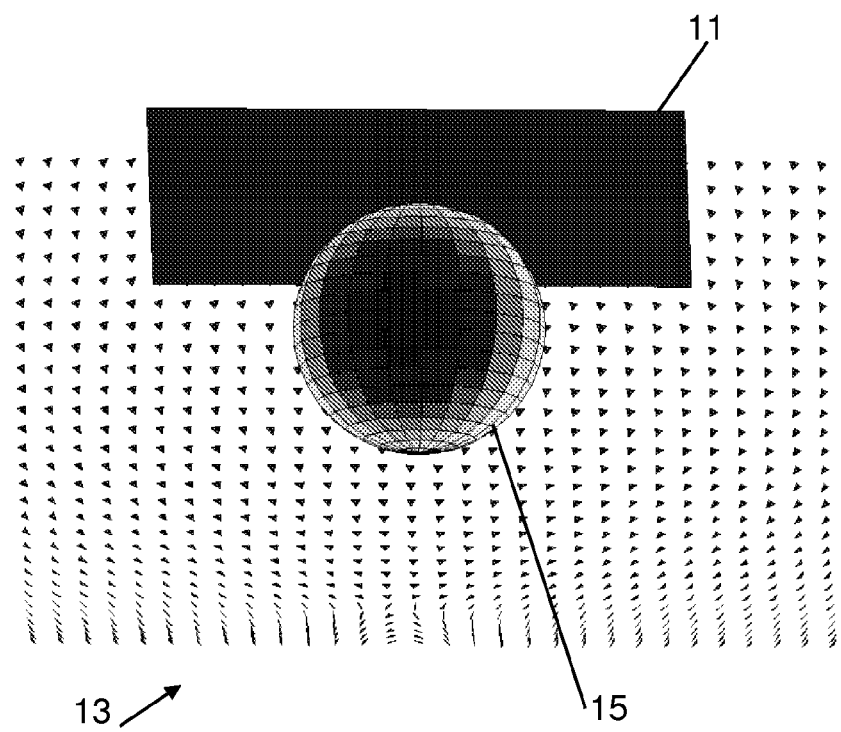

FIGS. 12 and 13 show a reflective surface created using the above techniques from two different perspectives. FIGS. 14 and 15 show a further refined version of the reflective surface of FIGS. 12 and 13, again from two perspectives. As can be seen from these figures, the configuration of the reflective optical surface is quite complex and bears little resemblance to the spherical or aspherical surfaces created by other optical design techniques. The individual surface elements may be splined together to create a smooth continuous surface, or so many surface elements may be calculated that the surface becomes smooth at a fine grain level.

Applications of reflective optical surfaces designed in accordance with the methods disclosed herein are set forth in commonly assigned and co-pending U.S. patent application Ser. Nos. 13/211,372 and 13/211,365, both filed Aug. 17, 2011, herewith in the names of G. Harrison, D. Smith, and G. Wiese, and D. Smith, G. Wiese, G. Cuddihy, and G. Harrison, respectively, entitled "Head-Mounted Display Apparatus Employing One or More Reflective Optical Surfaces" and "Head-Mounted Display Apparatus Employing One or More Fresnel Lenses," respectively, the contents of both of which are incorporated herein by reference.

The mathematical techniques discussed above, including the flow charts of FIGS. 10 and 11, can be encoded in various programming environments and/or programming languages, now known or subsequently developed. A currently preferred programming environment is the Java language running in the Eclipse Programmer's interface. Other programming environments such as Microsoft Visual C# can also be used if desired. Calculations can also be performed using the Mathcad platform marketed by PTC of Needham, Mass., and/or the Matlab platform from MathWorks, Inc., of Natick, Mass. The resulting programs can be stored on a hard drive, memory stick, CD, or similar device. The procedures can be performed using typical desktop computing equipment available from a variety of vendors, e.g., DELL, HP, TOSHIBA, etc. Alternatively, more powerful computing equipment can be used including "cloud" computing if desired.

Once designed, the reflective optical surfaces disclosed herein can be produced e.g., manufactured in quantity, using a variety of techniques and a variety of materials now known or subsequently developed. For example, the surfaces can be made from plastic materials which have been metalized to be suitably reflective. Polished plastic or glass materials can also be used. For "augmented reality" applications, the reflective optical surfaces can be constructed from a transmissive material with embedded small reflectors thus reflecting a portion of an incident wavefront while allowing transmission of light through the material.

For prototype parts, an acrylic plastic (e.g., plexiglas) may be used with the part being formed by diamond turning. For production parts, either acrylic or polycarbonate may, for example, be used with the part being formed by, for example, injection molding techniques. The reflective optical surface may be described as a detailed Computer Aided Drafting (CAD) description or as a non-uniform rational B-Spline NURBS surface, which can be converted into a CAD description. Having a CAD file may allow the device to be made using 3-D printing, where the CAD description results in a 3D object directly, without requiring machining.

A variety of modifications that do not depart from the scope and spirit of the invention will be evident to persons of ordinary skill in the art from the foregoing disclosure. For example, although reflective optical surfaces which provide the user with a large field of view, e.g., a field of view greater than or equal to 100°, or greater than or equal to 150°, or greater than or equal to 200°, constitute an advantageous embodiment of the invention, the methods and systems disclosed herein can also be used to create reflective surfaces having smaller fields of view. Furthermore, in various embodiments, reflective optical surfaces designed in accordance with the computer-based methods disclosed herein may provide a user with a full foveal dynamic field of view, a full foveal+peripheral static field of view, or a full foveal+peripheral dynamic field of view.

Similarly, although the invention has been illustrated for systems in which the light emitted from the display has not been collimated before it reaches the reflective surface, it is equally applicable to light that has been partially or fully collimated, e.g., by optical elements located between the display and the reflective surface. In such cases, the radii of curvature of the core surface elements will be adjusted to take account of the collimation of the light incident on the elements.

While embodiments have been described with reference to various embodiments, it will be understood by those skilled in the art that various changes, omissions and/or additions may be made and equivalents may be substituted for elements thereof without departing from the spirit and scope of the embodiments. In addition, many modifications may be made to adapt a particular situation or material to the teachings of the embodiments without departing from the scope thereof. Therefore, it is intended that the embodiments not be limited to the particular embodiment disclosed as the best mode contemplated for carrying out this invention, but that all embodiments falling within the scope of the appended claims are considered. Moreover, unless specifically stated, any use of the terms first, second, etc., does not denote any order or importance, but rather the terms first, second, etc., are used to distinguish one element from another.

What is claimed is:

1. A computer-based method for designing a free space reflective optical surface for use in a head-mounted display that reflects a virtual image of a display surface for viewing at a preselected spatial location by a user's eye, the method comprising using one or more computers to perform the steps of:

(a) representing, by the one or more computers, the display surface by a plurality of display objects based on optical properties not tied to a particular substrate or plane;

(b) representing, by the one or more computers, the free space reflective optical surface, not tied to a particular substrate or plane, by a plurality of surface elements, each surface element being characterized by (i) a spatial location relative to the display surface, a nominal user's eye, and the preselected spatial location of the virtual image, (ii) a normal, and (iii) a radius of curvature;

(c) associating, by the one or more computers, each display object with at least one surface element in the direction of which a virtual image of the display object at the preselected spatial location will be displayed to the nominal user's eye, each surface element being associated with a single display object;

(d) for each surface element:
  (i) defining an initial spatial location of the surface element;
  (ii) calculating, by the one or more computers, an initial direction of the surface element's normal using the surface element's initial spatial location, the location of the display object with which the surface element is associated, and the location of a center of rotation of the nominal user's eye so that light from the display object that reflects off of the surface element will pass through said center of rotation; and
  (iii) calculating, by the one or more computers, an initial radius of curvature for the surface element so that the virtual image of the display object is at the preselected spatial location; and
  (iv) calculating, by the one or more computers, a final spatial location of the surface element, a final direction of the surface element's normal, and a final radius of curvature for the surface element and a set of surrounding surface elements by iteratively adjusting the spatial locations of the surface elements until an error function satisfies a predetermined criterion; and (e) calculating a smoothed free space reflective optical surface based on the final spatial locations, the final directions of the normals, and the final radii of curvature of the plurality of surface elements.

2. The method of claim 1 wherein in step (d)(iv), the iterative adjusting of the spatial location of at least a first surface element is based at least in part on the radius of curvature and the normal of at least one second surface element, the first surface element being a nearest neighbor of the second surface element.

3. The method of claim 2 wherein the iterative adjusting of the spatial location of the first surface element is based on a calculated deviation of the element's spatial location from a sphere whose radius equals the second element's radius of curvature and whose center is along the second element's normal.

4. The method of claim 3 wherein the iterative adjusting comprises less than the entire calculated deviation.

5. The method of claim 1 wherein the iterative adjusting of the spatial location of the first surface element comprises iterative adjusting of a plurality of first surface elements is based at least in part on the radius of curvature and the normal of at least one second surface element, each of the plurality of first surface elements being a nearest neighbor of the second surface element.

6. The method of claim 5 wherein the plurality of first surface elements constitutes all of the nearest neighbors of the second surface element.

7. The method of claim 5 wherein the iterative adjusting of the spatial locations of the first surface elements is based on calculated deviations of the elements' spatial locations from a sphere whose radius equals the second element's radius of curvature and whose center is along the second element's normal.

8. The method of claim 7 wherein the iterative adjusting comprises less than the entire calculated deviations.

9. The method of claim 7 wherein the error function is based on the calculated deviations.

10. The method of claim 9 wherein the error function is based on a sum of absolute values of the calculated deviations.

11. The method of claim 10 wherein the predetermined criterion is a numerical value for the sum of absolute values.

12. The method of claim 5 wherein the iterative adjusting of the spatial locations of the first surface elements is weighted so that the iterative adjusting of at least one of the first surface elements is greater or smaller than it would have been without weighting.

13. The method of claim 5 wherein the second surface element is an edge surface element or a corner surface element and the iterative adjusting of the spatial location of at least one first surface element is weighted so that the iterative adjusting is greater than it would have been without weighting.

14. The method of claim 1 wherein when measured from the center of rotation of the nominal user's eye, an angle between at least two of the plurality of surface elements is greater than or equal to 100 degrees.

15. The method of claim 1 wherein when measured from the center of rotation of the nominal user's eye, an angle between at least two of the plurality of surface elements is greater than or equal to 150 degrees.

16. The method of claim 1 wherein when measured from the center of rotation of the nominal user's eye, an angle between at least two of the plurality of surface elements is greater than or equal to 200 degrees.

17. The method of claim 1 further comprising producing the free space reflective optical surface.

18. A computer program product embodied in a non-transitory computer readable medium operable by at least one processor for designing a free space reflective optical surface for use in a head-mounted display that reflects a virtual image of a display surface for viewing at a preselected spatial location by a user's eye, the computer program product comprising instructions that configure the at least one processor to:

represent the display surface by a plurality of display objects based on optical properties not tied to a particular substrate or plane;

represent the free space reflective optical surface, not tied to a particular substrate or plane, by a plurality of surface elements, each surface element being characterized by (i) a spatial location relative to the display surface, a nominal user's eye, and the preselected spatial location of the virtual image, (ii) a normal, and (iii) a radius of curvature;

associate each display object with at least one surface element in the direction of which a virtual image of the display object at the preselected spatial location will be displayed to the nominal user's eye, each surface element being associated with a single display object;

for each surface element:
  define an initial spatial location of the surface element;
  calculate an initial direction of the surface element's normal using the surface element's initial spatial location, the location of the display object with which the surface element is associated, and the location of a center of rotation of the nominal user's eye so that light from the display object that reflects off of the surface element will pass through said center of rotation;

calculate an initial radius of curvature for the surface element so that the virtual image of the display object is at the preselected spatial location; and calculate a final spatial location of the surface element, a final direction of the surface element's normal, and a final radius of curvature for the surface element and a set of surrounding surface elements by iteratively adjusting the spatial locations of the surface elements until an error function satisfies a predetermined criterion; and calculate a smoothed free space reflective optical surface based on the final spatial locations, the final directions of the normals, and the final radii of curvature of the plurality of surface elements.

19. A system for designing a free space reflective optical surface for use in a head-mounted display that reflects a virtual image of a display surface for viewing at a preselected spatial location by a user's eye, comprising:

a processor; and a memory unit coupled to the processor, said memory unit storing a computer program which includes programming instructions for performing the method of:

representing the display surface by a plurality of display objects based on optical properties not tied to a particular substrate or plane;

representing the free space reflective optical surface, not tied to a particular substrate or plane, by a plurality of surface elements, each surface element being characterized by (i) a spatial location relative to the display surface, a nominal user's eye, and the preselected spatial location of the virtual image, (ii) a normal, and (iii) a radius of curvature;

associating each display object with at least one surface element in the direction of which a virtual image of the display object at the preselected spatial location will be displayed to the nominal user's eye, each surface element being associated with a single display object;

for each surface element:

defining an initial spatial location of the surface element;

calculating an initial direction of the surface element's normal using the surface element's initial spatial location, the location of the display object with which the surface element is associated, and the location of a center of rotation of the nominal user's eye so that light from the display object that reflects off of the surface element will pass through said center of rotation; and calculating an initial radius of curvature for the surface element so that the virtual image of the display object is at the preselected spatial location; and calculating a final spatial location of the surface element, a final direction of the surface element's normal, and a final radius of curvature for the surface element and a set of surrounding surface elements by iteratively adjusting the spatial locations of the surface elements until an error function satisfies a predetermined criterion; and calculating a smoothed free space reflective optical surface based on the final spatial locations, the final directions of the normals, and the final radii of curvature of the plurality of surface elements.

* * * * *